United States Patent [19]

Amberg et al.

[11] E Re. 31,293

[45] Reissued Jun. 28, 1983

[54] MACHINE FOR PRODUCING A PLASTIC-COVERED GLASS CONTAINER

[75] Inventors: Stephen W. Amberg, St. James; Thomas E. Doherty, Setauket, both of N.Y.; Clarence A. Heyne, deceased, late of Sun City, Ariz.

[73] Assignee: Owens-Illinois, Inc., Toledo, Ohio

[21] Appl. No.: 189,265

[22] Filed: Sep. 22, 1980

Related U.S. Patent Documents

Reissue of:

[64] Patent No.: ~~8,224,398~~ 3822459
Issued: Jul. 9, 1974
Appl. No.: 378,002
Filed: Jul. 10, 1973

U.S. Applications:

[62] Division of Ser. No. 209,751, Dec. 20, 1971, Pat. No. 3,802,942.

[51] Int. Cl.[3] ..... B31B 1/16; B31C 1/00

[52] U.S. Cl. ..... 493/11; 493/112; 493/303; 493/306

[58] Field of Search ..... 493/306, 305, 303, 287, 493/105-107, 112, 155, 108, 239, 11

[56] References Cited

U.S. PATENT DOCUMENTS

| | | | |
|---|---|---|---|
| 1,399,636 | 12/1921 | Malm | 493/287 X |
| 1,614,643 | 1/1927 | Barlow | 493/287 X |
| 2,091,771 | 8/1937 | Smithwick | 493/287 X |
| 3,195,228 | 7/1965 | Beacham | 29/774 X |
| 3,267,566 | 8/1966 | Quellette | 29/775 |
| 3,439,404 | 4/1969 | Pearson | 29/775 |
| 3,959,065 | 5/1976 | Ashcroft | 156/423 |
| 4,250,798 | 2/1981 | Yamato et al. | 493/306 |

FOREIGN PATENT DOCUMENTS

| | | |
|---|---|---|
| 781907 | 8/1957 | United Kingdom . |
| 781908 | 8/1957 | United Kingdom . |

*Primary Examiner*—James F. Coan
*Attorney, Agent, or Firm*—D. T. Innis; M. E. Click; D. H. Wilson

[57] ABSTRACT

The disclosure relates to a machine for making a plastic covering on a rigid base article which in the illustrated form comprises a glass bottle and a conforming shrunken plastic covering thereon. The plastic is fed in oriented sheet form to the turret apparatus, cut into lengths and wrapped and seamed on successive mandrels as sleeves. Bottles are simultaneously processed to preheat condition and indexed over the sleeves, the latter telescopically assembled on the rigid base article, i.e., the bottle, and the combination carried to a heat tunnel. The plastic sleeve shrinks into snug surface fit on the adjacent surface portion of the rigid base article.

The bottle is preheated in one of two embodiments by: (1) a preheat tunnel on the machine which raises the bottles from room temperature to about 220° F., or (2) the preheat is carried over as latent heat in the glass bottle from the annealing lehr, a part of the bottle manufacturing process.

The machine includes novel subassemblies comprised of (1) a bottle chuck and loading station for assuring proper loading of the bottles on the machine, (2) bottle handling, (3) plastic strip handling and feed mechanism for placing oriented cut lengths onto mandrels of the turret, (4) the turret for making seamed sleeves in succession and feeding them onto registered bottles carried by the bottle handling apparatus, and (5) unloading device for transfer of the covered bottles to a conveyor and with said transfer smoothening the bottom surface of the covering on the bottle.

2 Claims, 39 Drawing Figures

FIG. 24
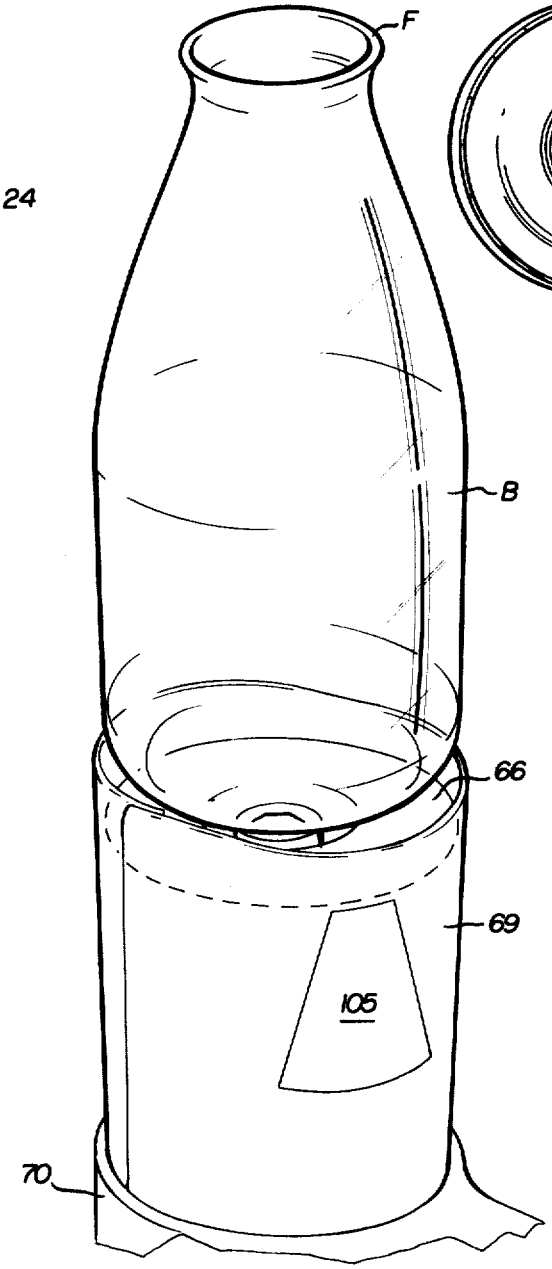
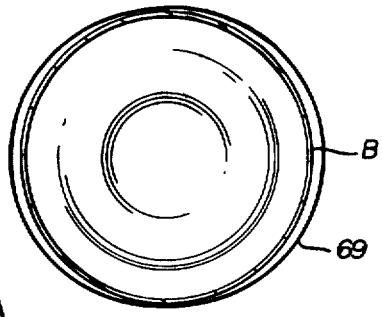
FIG. 24a

MACHINE FOR PRODUCING A PLASTIC-COVERED GLASS CONTAINER

Matter enclosed in heavy brackets [ ] appears in the original patent but forms no part of this reissue specification; matter printed in italics indicates the additions made by reissue.

This is a division of U.S. Pat. application Ser. No. 209,751 filed Dec. 20, 1971, *now U.S. Pat. No. 3,802,942.*

The present invention relates to a machine for making and applying a plastic covering onto a rigid base article, i.e., a glass bottle.

BACKGROUND OF THE INVENTION

The process of copending U.S. Pat. application, Ser. No. 158,480 filed June 30, 1971, entitled "Method of Making a Plastic-Covered Glass Container", now U.S. Pat. No. 3,767,496, provides a need for a production machine to produce the plastic covering on a rigid base article, such as the glass bottle.

SUMMARY OF THE INVENTION

In the present invention, an automatic production machine in a combination of elements is provided for making the succession of cylindrical sleeves on one part of the machine from lengths cut from a roll supply of shrinkable, predecorated plastic web material; and, on another part of the machine, bottles are loaded at spaced centers of a carriage comprised of neck gripping chucks on an endless chain and carriage. The carriage of the machine cooperates in its path with the sleeve making part of the machine in travel on a common vertical axis to perform the transfer and assembly of a sleeve onto a bottle. Manipulations of the bottles in elevation during movement with the endless carriage is by cams on the machine engaging the individual chucks. Along the path of the carriage on either side of the sleeve making turret are substructures of the machine to provide for temperature conditioning of the glass bottle, shrinking the sleeve on the bottle and bottom finishing of the covering combined with unloading the finished article.

In the machine, subcombination structures provide the following:

1. New bottle centering chuck mechanism for loading, conveying, manipulating and unloading bottles, the chuck gripping the bottles by the neck and finish portion.
2. Conveyance through bottle handling apparatus on endless carriage extending through a heating tunnel, end-turn whereat assembly steps in the production are performed, thence through a heat tunnel and bottle surface finishing and unloading.
3. Bottle timing and loading to the carriage.
4. Safety feature on the chucks to prevent bottle breakage on misaligned bottles fed by the timing device at loading.
5. Mechanism in a turret for rotary movement of mandrels on a centered diameter that is coaxial and equal to the diameter of the chuck centers at the end turn of the bottle chucks and carriage.
6. Controlled orientation and rotation of the mandrels on the turrets for receiving and wrapping plastic into cylinder shapes thereon.
7. Heat seaming of the plastic on the mandrels.

8. Stripping devices for raising the sleeve to the desired elevation on the bottle.
9. Feed device for making lengths of plastic from a web roll supply and feeding the lengths to the mandrels in succession.
10. Drive structure for synchronous operation of the elements of the machine.

Although the structure herein described is characterized in terms of the preferred embodiment, namely the production of a plastic-covered glass bottle, the invention may be utilized in forming the plastic cylinder-like sleeve and applying it and shrinking it over a variety of rigid base articles, including, for example, an iron shaping mold. In the latter example, the iron mold specifies the shrunken form of the plastic covering that may be stripped and finished to another article, such as a convenience cup, container or like vessel.

Various combinations of utilization of the subcombinations in the disclosed machine, or in modifications for utilization of the machine for the production of various articles thereon will undoubtedly occur to those skilled in the art. Although a preferred embodiment is herein disclosed, such disclosure is in no way intended as limiting the invention beyond the scope set out in the appended claims.

BRIEF DESCRIPTION OF THE DRAWINGS

FIG. 24 is a spatial perspective view like FIG. 23 illustrating bottle and sleeve vertical alignment at the turret of the machine whereat the sleeve is telescopically inserted over the bottle.

FIG. 24A is a plan sectional view of the bottle and sleeve when the two are telescopically assembled.

GENERAL DESCRIPTION OF THE MACHINE

Figure 29:
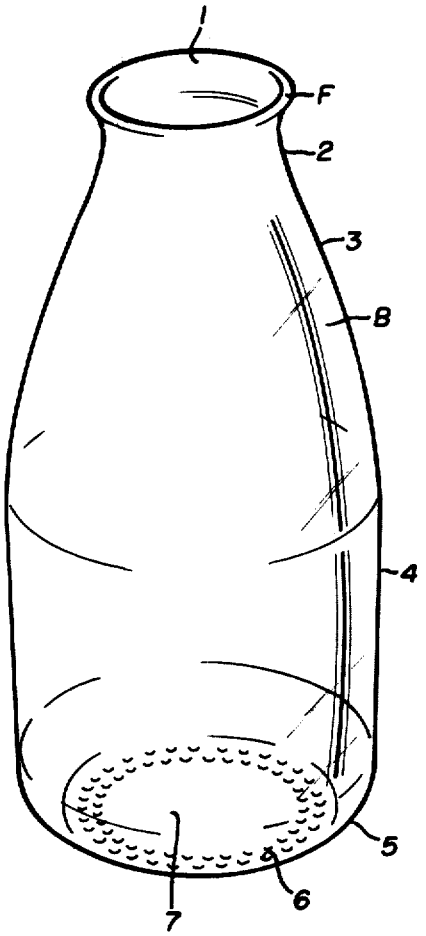
FIG. 29 is a front perspective view of the glass bottle utilized in the assembly with a plastic sleeve.

The machine comprises several components connected together to operate as a unit for production of plastic sleeves shrunken over the rigid base article. The base article in the examples of the present disclosure is a glass bottle B, such as the one shown on FIG. 29. Bottle B has a circular lip or rim F that provides a bead-type finish defining the mouth opening 1. Along the side of bottle B below finish F the wall is somewhat frusto-conically tapered inwardly and then flared outwardly in the flared neck region 2. Neck 2 merges smoothly with the outwardly tapering shoulder 3 which merges into the lower cylindrical body 4. At the bottom of body 4 is a radius corner or heel 5 for the bottle that blends into a bottom annular bearing surface 6, herein shown as stippled. Inwardly of bearing ring 6, the bottom 7 of the bottle is upwardly dished, i.e., concave.

The object of the invention is to apply a plastic covering over the body 4, some of the adjacent shoulder 3, the heel 5 and bearing 6. This is done by first forming a pre-printed (preferably) shrinkable, foamed plastic sleeve from a web of polystyrene plastic on the order of 20 thousandths of an inch in thickness, for example. The plastic material is brought to the machine as a roll 15a of prepared stock.

A multicolor decoration is printed repeatedly along the plastic supply web 15. The print of decoration is made over a span of web 15 a bit less than the length dimension of a blank to be cut from the web.

Along the length of the web 15 are printed several indicia marks. The space between these marks (which may be a dot or a fine transverse line) is equal to the length dimension of a sleeve blank. The single decoration pattern for the sleeve is printed between two adjacent indicia. The width dimension of supply web 15 is equal the height dimension for the sleeves to be subsequently formed therefrom. The supply web 15 is provided in a roll of printed strip stock of specially oriented plastic material on the drum.

With a supply of bottles B and supply of prepared plastic 15, the machine has the following components. A bottle infeed guides a line of bottles into a worm spacing them to correspond with the center spacing on overhead bottle chucks. The chucks travel on an endless driven carriage to transport the bottles through a pre-heater (if necessary), past the plastic sleeve forming turret whereat the fabricated sleeves are assembled telescopically, then into and through a tunnel oven at about 400° F. wherein the sleeves shrink to conform to the article, and to an unloading station.

In time with the bottle handling apparatus the sleeve making device receives plastic web from the supply roll. This is guided in oriented fashion onto a feed drum whereat lengths are cut and transferred to mandrels. The lengths are each wound onto the cylinder-like mandrels and seamed at an end-to-end overlap region to form a sleeve. The mandrels move in time with the bottles about a common axis and diameter with the end turn of the bottle carriage; whereupon the sleeves are stripped from the mandrels and placed about the body of the bottles.

Figure 1:
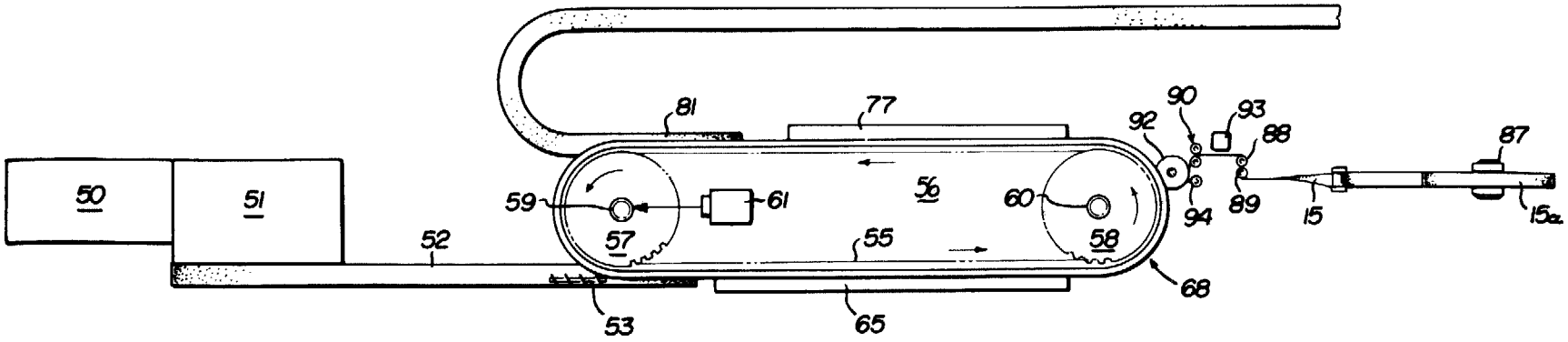
FIG. 1 is a top plan view illustrating the "off-line" embodiment of the invention, wherein bottles are loaded to the machine at approximately room temperature and pre-heated in the machine to condition them for the application of the plastic sleeves.
Figure 2:
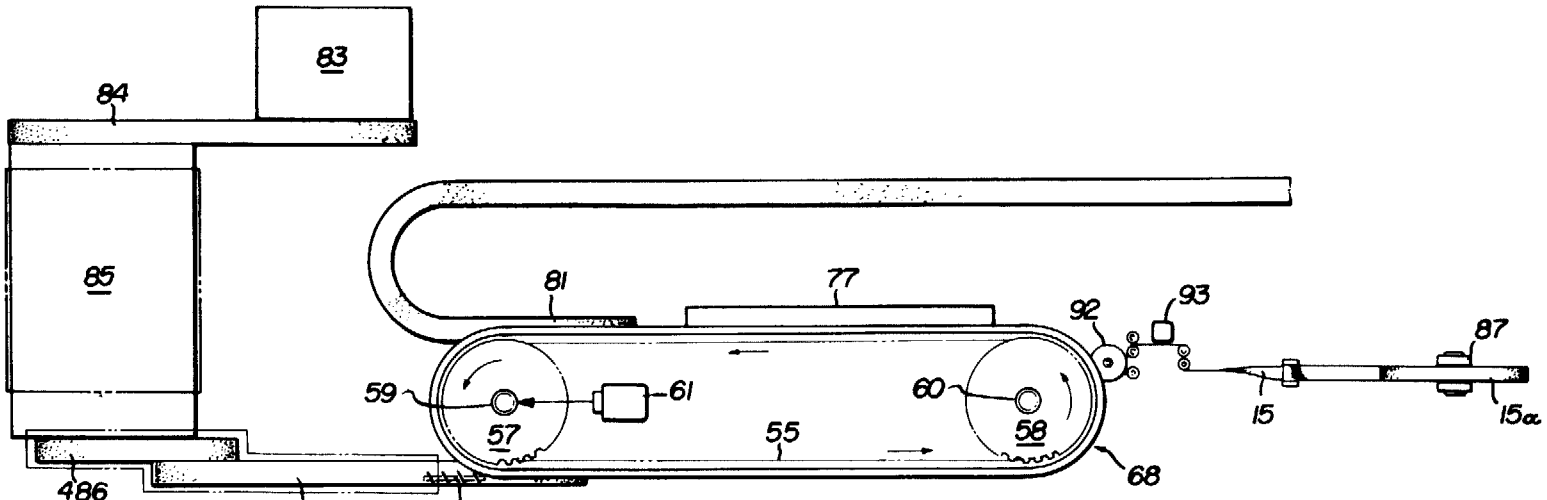
FIG. 2 is a top plan view like FIG. 1, but illustrating a second embodiment of the invention referred to herein as the "on-line" embodiment, wherein glass bottles are delivered from the annealing lehr of the bottle manufacturing line at an elevated temperature and loaded to the machine for applying the plastic sleeves, the latent heat of manufacture of the bottle being utilized in the application of the plastic sleeve.

As seen on the FIGS. 1 and 2, the machine may be either of the two disclosed types.

OFF-LINE EMBODIMENT—FIG. 1

The "off-line" embodiment, as called herein, involves glass bottles that are first manufactured and handled in the normal fashion. The bottles are collected and transported, or stored, and then transported to an area such as a depalletizer unit 50 whereat they are fed through a conventional unscrambler unit 51 and moved in a line or lines onto infeed conveyor 52. Conveyor 52 advances the glass bottles B (see FIG. 29) into the infeed timing worm 53 which spaces the bottles B and times them under linearly spaced chucks 54 of the bottle handling conveyor (see FIG. 4). Chucks 54 (more specifically described hereinafter) are connected at equally spaced intervals on a carriage chain 55 of the bottle handling apparatus 56 traveling in an endless path extending about end turns at the sprockets 57 and 58 supported by their vertical shafts 59 and 60 respectively on handling apparatus 56. The shaft 59 is connected to a drive transmission or gear box (described in detail hereinafter) operated by a drive motor. Carriage 55 for the bottle chucks 54 is driven in a counterclockwise direction about the endless conveyor path defined by machine sprockets 57 and 58.

Figure 4:
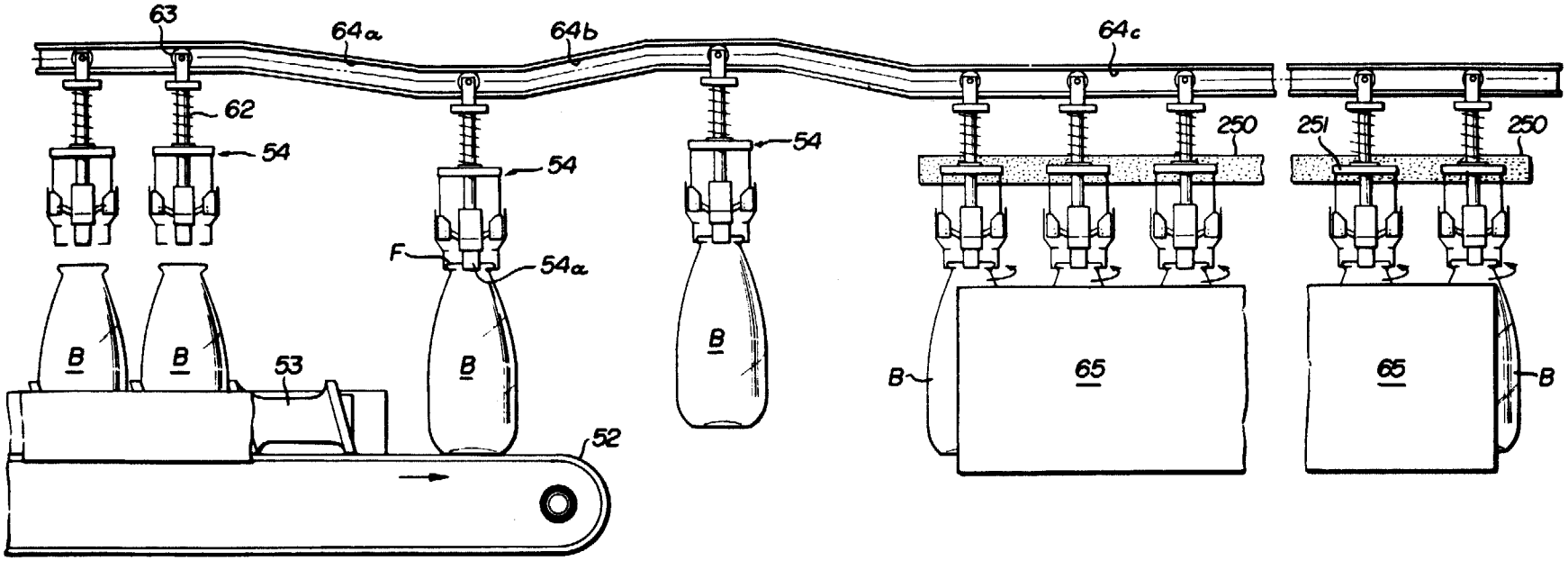
FIG. 4 is a side elevational view of a portion of the bottle handling apparatus of the invention at the bottle loading side of the machine.
Figure 5:
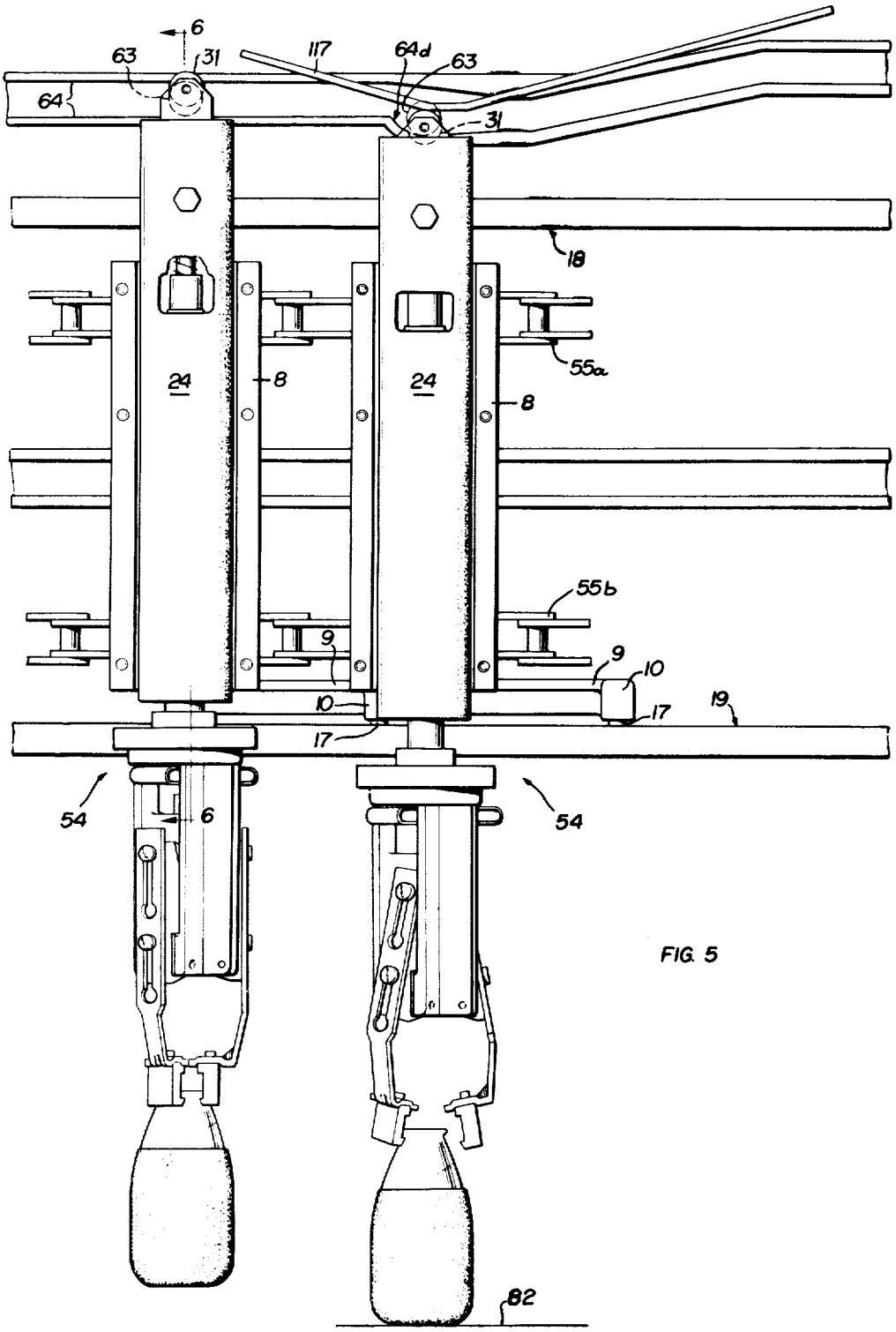
FIG. 5 is a side elevational view of a portion of the bottle handling apparatus including the bottle holding chuck of the invention, the chuck of the apparatus being shown at the bottle unloading station on the machine.
Figure 6:
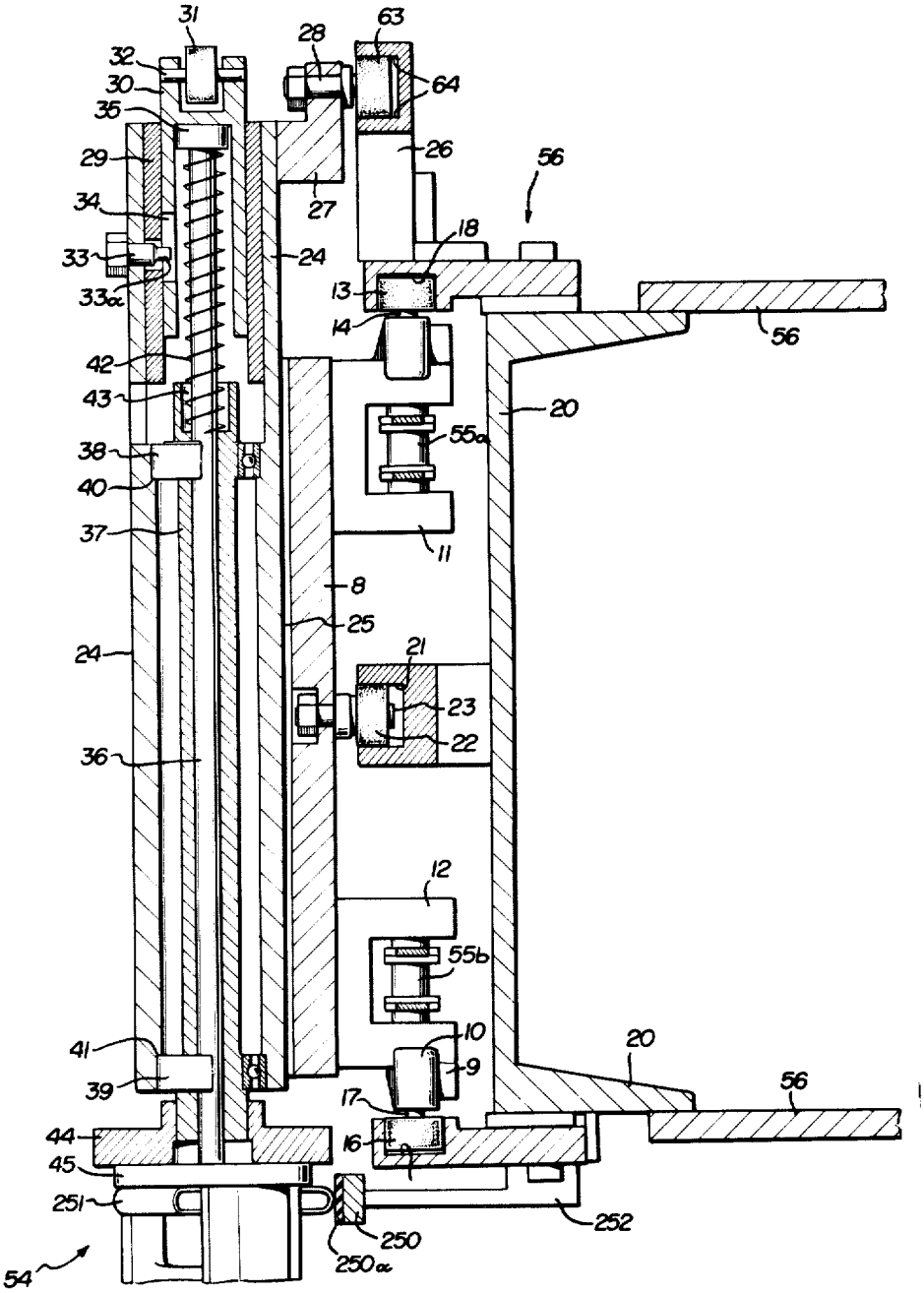
FIG. 6 is a sectional elevational view taken along line 6—6 on FIG. 5.

Referring to FIG. 4, chucks 54 are manipulated in vertical elevation by having their center spindle 62 connected to a roller-follower 63 running in a cam track 64 extending about the path of the carriage 55 on machine 56. As the bottles B are released at the end flight or land of timing worm 53, the axis of bottle B is timed in movement with the center of a chuck 54. The downwardly sloped section 64a of the cam track both lowers the chuck 54 and closes its jaws 54a about the top head or rim F of the bottle finish, grasping the bottle in the chuck for carrying it with movement of the carriage 55 in the path prescribed thereby. After grasping the bottle, cam section 64b raises and lifts the chuck and bottle from the conveyor 52.

In this, the "off-line" embodiment of the invention, the bottles B are conditioned thermally by moving them through the heat tunnel 65 containing a source of heat, such as circulating hot air. During preheat, the bottles are preferably rotated, as shown on FIG. 4, by engaging a wheel 251 of the chuck with a stationary rail 250. The wheel running over the friction surface of the rail rotates the chucks and bottles about their central axes during travel of the bottles the length of tunnel 65. Rotation during preheat tends to elevate the bottle temperature more uniformly.

An important feature in operation of the machine is having bottles B at elevated temperature (on the order of 175° F. or greater) at the time the plastic sleeve is applied. The tunnel preheat oven will preheat the bottles carried and rotated by chucks 54 through this oven to a temperature in the range of 175°–300° F. For example, using expanded or foamed polystyrene plastic material, it is preferable the glass of bottles B having a wall temperature on the order of 220° F. This aids in control over the contour of the shrunken sleeve. The preheat temperature of the glass will vary depending on the character of the plastic used for the sleeves, i.e., the composition and thickness.

Figure 21:
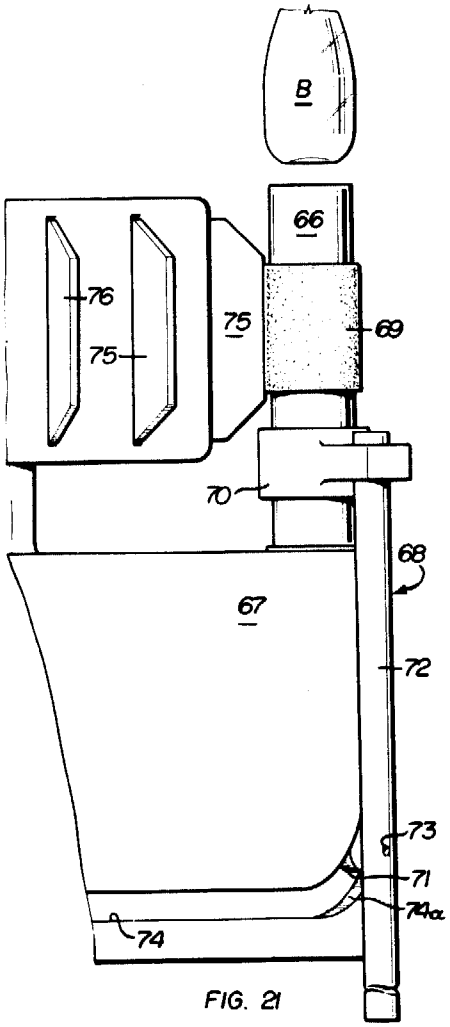
FIG. 21 is a partial side elevational view of the machine whereat the bottles and plastic sleeves are telescopically united.

After bottles B emerge from tunnel 65 at elevated temperature, they are carried in a circular path around an end turn at gear 58 and axially aligned vertically over mandrels 66 (FIG. 21). Mandrels 66 are spaced equally around the turret 67 of sleeve forming machine 68. The turret 67 is driven by a differential transmission (not shown) connected to the vertical shaft 60 of the bottle handling machine which is in turn connected to gearing on turret 67. Thus, the turret 67 is synchronized to move with the carrier 55 and mandrels 66 on turret 67 may be advanced or retarded with respect to the centers of the chuck 54 on carrier 55 by the differential transmission.

Figure 25:
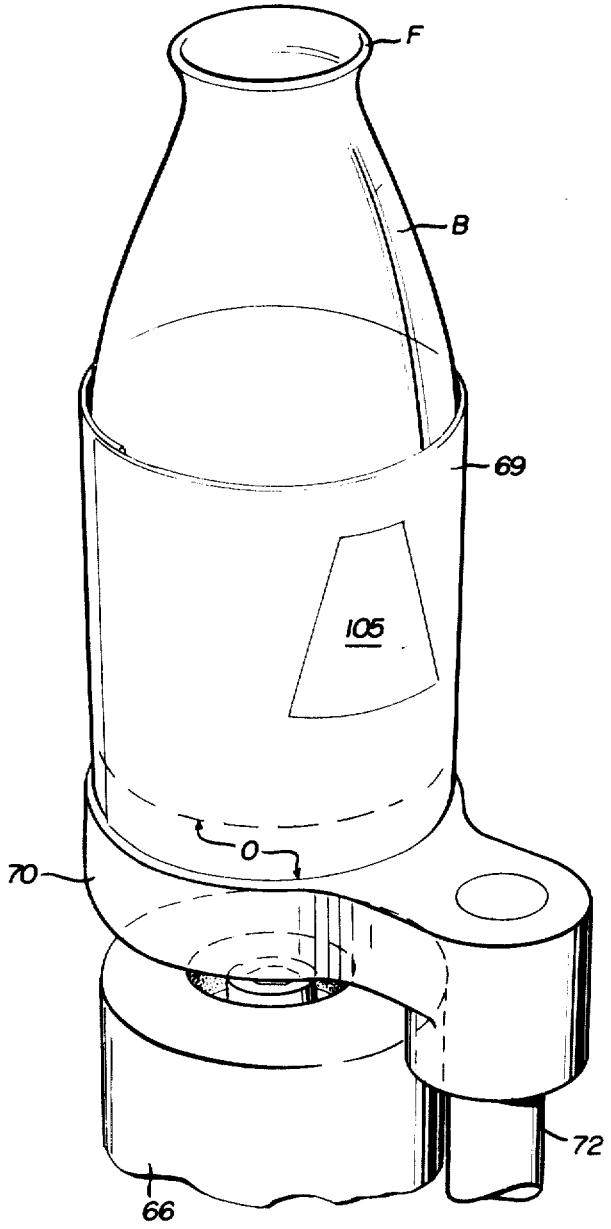
FIG. 25 is a perspective view of the bottle and sleeve in the initial assembly relationship prior to heat shrinking the sleeve onto the bottle.

As the bottles B travel in overlying registered fashion with mandrels 66 (see FIG. 3), the plastic sleeves 69 thereon are raised and inserted telescopically over the lower end of the bottles. This is accomplished in the "ejection cycle" portion of the machine 68 as follows. Referring to FIG. 24, the relationship of bottle B and sleeve 69 is illustrated at the beginning of the ejection cycle. A stripper sleeve 70 is journaled over mandrel 66 and when raised, sleeve 70 shifts plastic sleeve 69 vertically from mandrel 66 and onto bottle B (see FIG. 25). The vertical movement of plastic sleeve 69 is controlled by cam roller 71 (FIG. 21) rotatably mounted on rod 72 by shaft 73. Roller 71 runs on lower cam 74 attached in stationary relationship to the rotary turret 67. The rising segment 74a of the cam elevates rod 72 and stripper 70 to the proper height for sleeve 69 over the bottle body (see FIG. 25). Cam 74 then recedes and stripper 70 is lowered again to the lowermost, inactive position. As represented on FIG. 3, the stripper 70 will operate through one reciprocal raising and lowering cycle during each revolution of machine turret 67.

Sleeve 69 is dimensioned by mandrel 66 to be just slightly larger than the body diameter of bottle B. The heat of bottle B initiates slight shrinkage of the plastic sleeve and this combined with the "egg-shaping" of the sleeve 69 after stripping it from the mandrel will hold the sleeve in place on the bottle for the next step of the process.

The plastic sleeve 69 is seamed by heat and pressure applied through the hot seamer 75, one seamer 75 being supplied on turret 67 radially inwardly and opposite each mandrel 66. Seamer 75 has a forward bar-like surface 76 shifted radially outwardly into contact with overlapping end portions of the plastic material for sleeve 69 wrapped around mandrel 66. Bar 76 is heated by internal electrical resistance heater means (not shown). The joining of the ends of the plastic provides an axial seam of sleeve 69. As seen on FIG. 24A, after sleeve 69 is released from the mandrel 66, this discontinuity in the sheet of plastic by forming the axially directed seam creates the tendency for the sleeve to assume a somewhat "egg shape" and thereby frictionally engage the overhead bottle to assist holding sleeve 69 in place. Looking at FIG. 3, the sleeve 69 is placed on and thereafter carried by the bottle B from about the 10 o'clock position on turret 67 to about the 6 o'clock position. The path of the carrier for the bottle chucks diverges tangentially at the 6 o'clock position. Looking at FIG. 1, this tangential position occurs also at the 12 o'clock position on that Figure.

Figure 28:
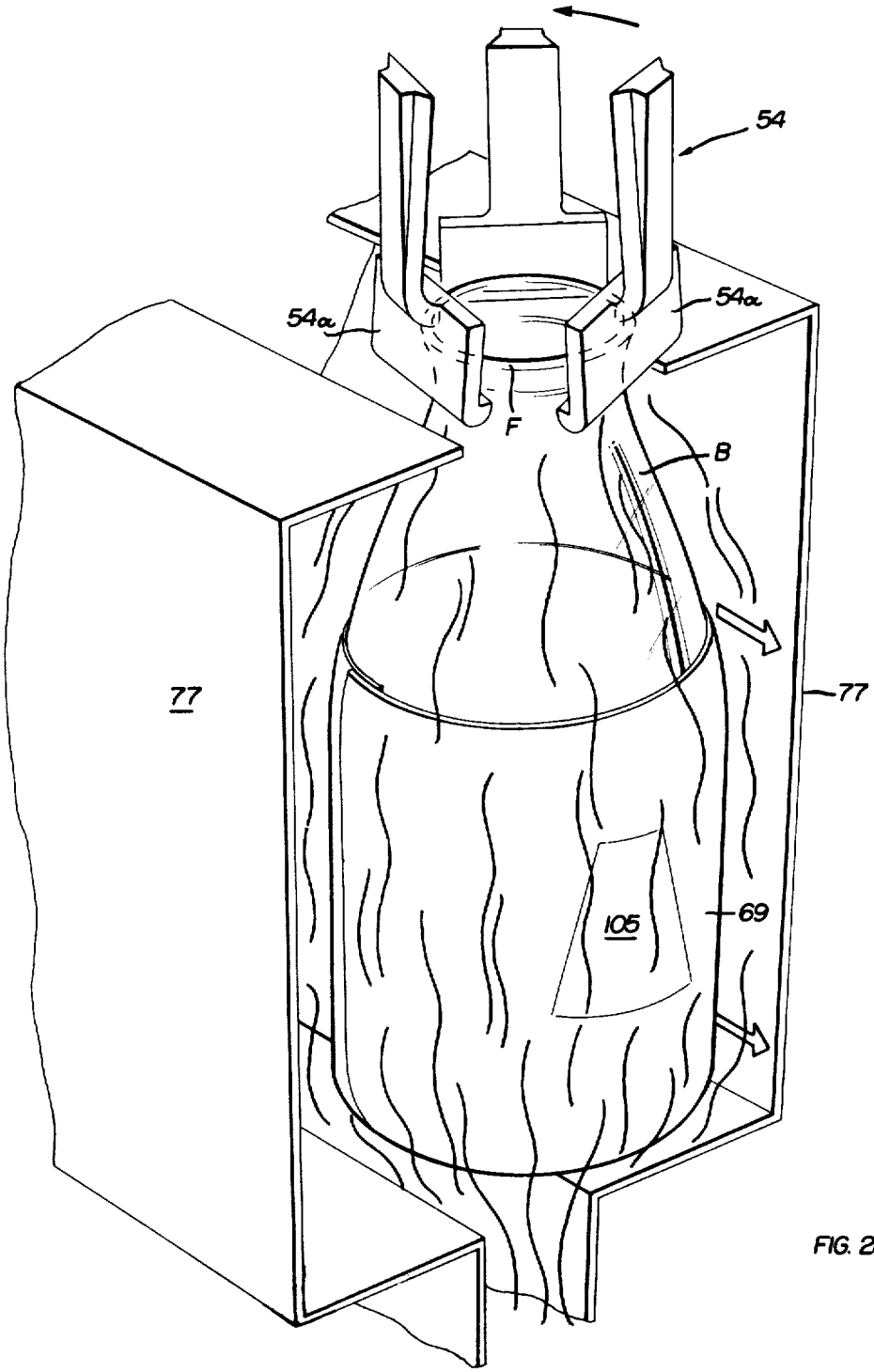
FIG. 28 is a perspective view showing the sleeve-bottle assembly in the heating runnel whereat the sleeve is shrunken to the bottle.

The carrier 55 next transverses the length of tunnel 77 in which the bottles are rotated during longitudinal movement. Tunnel 77 is an elongated oven chamber heated to a temperature for shrinking the sleeve 69 onto the contours of bottle B in a snug fitting relationship. This step is illustrated on FIG. 28 which portrays the bottle and plastic sleeve shrunken thereon while in the oven tunnel 77.

The oven chamber 77 is constructed to receive heated air circulated vertically for movement over the bottles as they are moved longitudinally of the chamber. The air temperature may vary widely depending upon the composition of plastic being used, its thickness in the sleeve and the time available in the tunnel for completing the shrink of the sleeve onto the bottle.

Another form of heat may be supplied by a tunnel bank of infra-red heat lamps arranged to the heat the articles and sleeves as they are rotated and traverse the length of this oven chamber 77.

In the case of foamed polystyrene of about 0.020 inch thickness, and a residence time in the tunnel of from 4 to 6 seconds, heated circulated air at approximately 400° F. will shrink the plastic sleeve suitably into conforming snug fit onto the bottle. The residence time in the chamber 77 will be a function of production rate; however, at a rate of say 150 pieces per minute the tunnel need not be unusually long to obtain a 4–6 second heating step.

As a variable, polyethylene used in making sleeve 69 requires a higher temperature of the oven and more time. Most shrinkable thermoplastics that are practical and economical for making the product may be operable at reasonable production rates at oven temperature in the range of 175°–800° F. Using a hot or heated glass bottles enhances performance and obtains superior results, i.e., by having the bottle at a temperature in the range of 175°–300° F. at the time the plastic sleeve is put on the bottle, depending upon the plastic material being used and the sleeve thickness.

Figure 27:
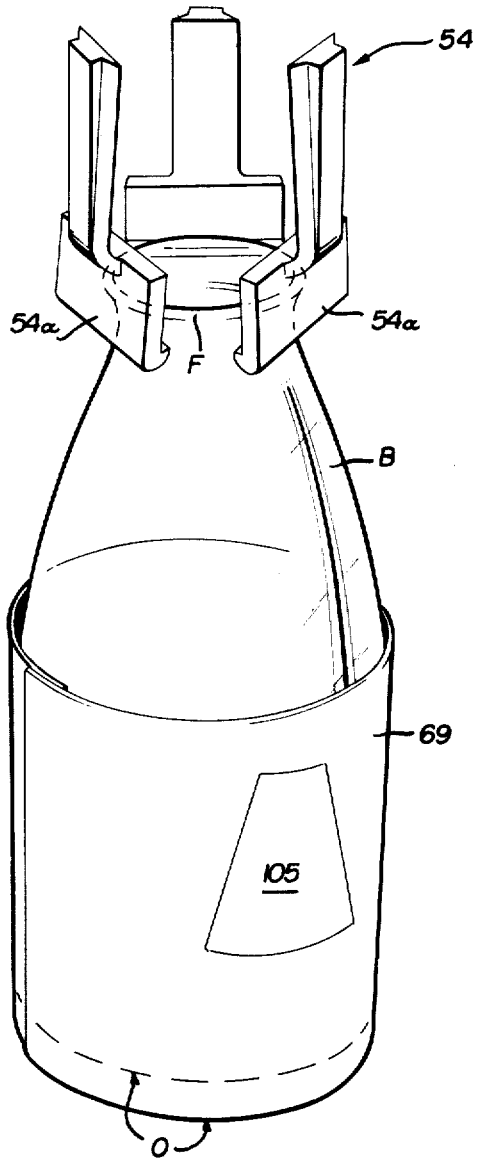
FIG. 27 is a spatial perspective view, somewhat schematic, showing the conveying of the bottle and sleeve to the heating tunnel.
Figure 30:
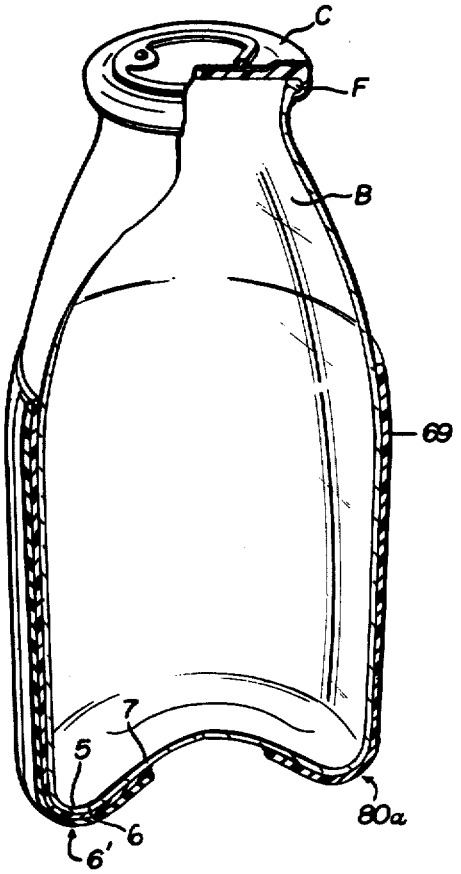
FIG. 30 is a front sectional perspective view of a container assembly made by the present invention and including a closure applied to seal product in the package.

In placing the plastic sleeve 69 over the bottle B, the bottom edge of the sleeve extends below the bottom surface of bottle B by an amount indicated as "0". (See FIGS. 25 and 27). After the sleeve is exposed to heat in tunnel 77, wherein the bottle is preferably rotated, the lower end of the plastic sleeve shrinks around the lower end corner radius of the bottle, indicated at 5 on FIG. 30 and along the bottom surface 7 of the bottle to form the annular plastic bearing ring at 6 for supporting the plastic covered bottle B on a level surface. The orientation of the plastic material in the cross direction T (FIG. 22) assists in the shrinkage of the sleeve around the heel corner of the bottle and snugly over the bottom bearing ring surface. Along the opposite upper end of the sleeve, this orientation factor also assures a smooth line and snug fit of the sleeve over the sloped neck portion of the bottle. The ratio of the T and M direction orientation in the plastic blank is very material in achieving an end product in which the sleeve fits snugly and smoothly in a pleasing outline over the bottle.

Referring again to FIG. 26, after the finished bottles B' with shrunken plastic covering thereon emerge from oven 77, the machine carriage 55 conveys them toward the unloading conveyor 81. The chuck assembly rollers 63 follow a downwardly inclined segment 64d of the cam track which abruptly lowers the bottle onto a firm and flat upper surface section 82 of conveyor 81. This bumps the bottle B' on surface 82 and any resulting irregularity in the seam portion of the shrunken plastic sleeve present in the bearing ring 80a at the bottom of bottle B' will be ironed out by this force. The bearing surface at the bottom end of the bottle will then be stable, removing any irregular bumps or the like to cause the bottle to be a "rocker," i.e., unstable when resting on a horizontal support.

As shown on FIG. 1, the conveyor 81 transfers the finished bottles to a location for packing and shipment or storage. The resultant product is a glass bottle having a body wall surface, corner heel radius and annular portion of its bottom surface covered with a plastic layer that will cushion and protect the glass against abuse and impact.

ON-LINE EMBODIMENT—FIG. 2

The principal difference in the "off-line" embodiment of FIG. 1, just described, and the "on-line" embodiment of FIG. 2 resides in the supply of the hot blank or bare bottles B.

In the "on-line" embodiment, glass bottles are molded to final shape by a conventional bottle forming machine 83, such as the "I-S" Bottle Machine (individual section machine) manufactured and sold by Emhart Corporation and described, beginning at page 326, in "Handbook of Glass Manufacture," compiled and edited by F. V. Tooley, Ogden Publishing Company, New York, N.Y., second printing, 1957. Several other glass bottle making machines are described in the Handbook which may be equally applicable to the machine 83 represented on FIG. 2. The formed glassware (bottles B) are transferred by conveyor 84 to and through an annealing lehr 85. Lehr 85 is conventionally designed to operate so that the glassware is received at temperatures around 800°–1,000° F. from forming at machine 83. In the forward section of the lehr, the bottles are increased in temperature to above their strain point—which will vary for different glass compositions—generally for a soda-lime bottle glass this anneal point is on the order of 1,085°–1,100° F. Thereafter, the bottles are cooled in a controlled gradual manner to about ambient or handling temperature. However, in the present anneal cycle for the present invention, the lehr 85 will be operated or constructed to discharge its ware to a conveyor at a temperature suitable for the hot bottle introduction into the machine 56. Allowing for cooling in transfer, the bottles may leave lehr 85 at around 400° F. and be further cooled in the process to the desired 200°–220° F. at the time the bottles and plastic sleeves are joined at the machine 68. Removal from lehr 85 will proceed through an unloading device 486 and be placed onto the machine conveyor 52. While in a line on conveyor 52, the infeed worm 53 will load the now hot bottles B onto the carriage 55 by the chucks 54. The preheater structure (see 65 in FIG. 1) may or may not be used. A section of preheat structure 65 may be a useful means of controlling the cooling of the bottles on their way to the assembly with the plastic sleeve. In any event, the distinguishing saving in the "on-line" embodiment is first the use of latent heat of manufacture of the bottles as the initial heat in the "hot bottles" for the process; and, secondly, the extra handling of the ware after annealing, such as packaging, palletizing, storage and the like, is avoided, thereby saving on production costs.

BOTTLE HANDLING APPARATUS

The apparatus for handling the bottles in the machine is shown on FIGS. 4–13 and 26. The infeed timing worm 53 operates to retard the bottles on the infeed conveyor 52 and space successive bottles in vertical axial alignment, or nearly so, with the overhead bottle chucks 54, such as the two chucks at the left hand side of FIG. 4. The chucks are mounted on carriage brackets 8 (FIG. 5) that are fastened to the upper and lower carriage chains 55a and 55b respectively. The brackets 8 each have rigid C-shaped upper and lower mounts 11 and 12 (FIG. 6) which receive a pivotal pin connection of the upper chain 55a and lower chain 55b respectively. A roller 13 is rotatably carried on stub shaft 14 extending vertically from each upper C-mount 11. As seen on FIG. 5, a horizontal stabilizer bar 9 is fastened to a group, say three, of the lower C-mounts 12 on the chuck brackets 8. Depending from bar 9 are three pivot pins 17 held in bosses 10 and spaced longitudinally and the pins 17 each rotatably carry a roller 16 running in lower slot 19. The rollers 13 and 16 travel in the respective upper track slot 18 and lower track slot 19, which track slots open in opposed relation to each other. The slots 18 and 19 serve as guides around the path of carriage apparatus 56 and are bolted onto frame 20 of the handling apparatus 56.

A center guide track 21 is fastened to frame 20 of handling unit 56 and receives the roller 22 pivotally connected to each chuck assembly bracket 8 at pivot pin 23. In the construction described, the chuck brackets 8 are pulled by the chain 55a and 55b in their endless path about end-turn sprockets 57 and 58 of the handling unit 56 (see FIGS. 1 or 2). As schematically shown on FIGS. 1 and 2, sprocket 57 is drivingly connected by a differential transmission and electric drive motor unit 61. This motor unit 61 is synchronously phase connected with the drive unit for the sleeve making turret and feed device, to be described hereinafter, so that the chain 55 may be driven in synchronism—phase and speed—with the sleeve making turret. (This other drive unit is shown on FIG. 18).

The chucks 54 are each vertically, slidably mounted by the vertical cylinder 24 set in vertical slide way 25 on the carriage bracket 8. The vertical position of cylinder 24 with respect to bracket 8 is controlled by the cam roller 63 running in cam track 64 fastened to frame 20 of the handling apparatus 56 above guide track 18 by the pillow blocks 26 spaced along the guide track of the machine. Roller 63 is pivotally attached to the bracket 27 by pivot pin 28. The track 64 thus controls the vertical elevation position of the chuck cylinder 24 on the machine.

BOTTLE CHUCKS

The bottle chucks 54 are constructed to provide assured pick-up of bottles that are slightly misaligned; either misaligned longitudinally with the center of the chuck along the path, or misaligned laterally with the chuck on said path, or both. If the bottle is seriously misaligned, the chuck will avoid picking up the bottle and it will topple off the end of infeed conveyor 52 into a suitable receptacle. This prevents jam-ups on loading. Another feature of the chuck is the yieldable jaw mounting. If the misalignment of the bottle is serious and the lowering chuck jaw fails to clear past the finish rim F of the bottle, the individual jaw of the multi-jaw construction is independently yieldably mounted on the chuck. Tipped bottles and broken bottles from jam-ups or interference is avoided.

The cylinder housing 24 of each chuck has an upper sleeve 29 press fit in its upper end. Sleeve 29 provides a cylinder bore for axial sliding movement of the cam piston 30. Cam roller 31 is rotatably mounted on a shaft 32 on the upper yoke of piston 30. Axial sliding movement of piston 30 in cylinder sleeve 29 is limited by the radially extending pin 33 fastened through the wall of cylinder 24 and extending through sleeve 29. The inner end 33a of the pin extends into the space provided by a vertical slot 34 provided in the sleeve 29. The piston 30 engages the head 35 on chuck rod 36. Rod 36 extends axially of the chuck cylinder 24 and is housed in the hollow arbor member 37. Arbor 37 has upper and lower ball bearing supports 38 and 39. The collars of bearings 38 and 39 are press fit in annular recesses 40 and 41, respectively, on the inner wall of cylinder 24. Arbor 37 supports the chuck jaws and guides the chuck actuating rod 36. Rod 36 is spring loaded by spring 42 compressed between the cup recess 43 on arbor 37 and the under side of piston 30. The spring 42 normally extends the rod 36, piston member 30 and cam roller 31 upwardly, this upward movement being limited by pin 33a engaging the lower edge of slot 34.

The chuck 54 is supported from the collar 44 attached to the lower end of arbor 37. The collar 44 has a pulley wheel 251 attached rigidly to the chuck 54. The chuck is rotatable about its central axis in ball bearings 38, 39 and wheel 251 (FIG. 6) is arranged to engage, at certain times, a linear rail 250 having a face coating of friction material 250a, such as rubber. The rail 250 is fastened by lateral bracket 252 to the carriage frame 56. The linear rail 250 is located along the span of the preheater 65 and the shrink oven 77 for selectively rotating the bottles in chucks 54 in those portions of travel about the carriage path. A circular plate 45 is fixed to the underside of collar 44 and has a center axial bore through which rod 36 extends for reciprocating movement. Near the periphery of collar 44 are three vertically depending leg members 46, each of which are substantially V-shaped in section (see FIG. 12). Three hinge pins span laterally between the legs 46 and provide a pivot for the three chuck jaws 54a. The jaws 54a are disposed about the actuating rod 36 at the sides of an equilateral triangle, rod 36 being located centrally of the triangular arrangement. Each of the chuck jaws 54a is fastened onto an inturned end 48 of a strap-like L-shaped holder 49 by cap screw 49a. Holder 49 is shiftably mounted on rock arm 78, its lower end being pivotally supported by pin 47 in the adjacent leg members 46. The means for mounting holder 49 onto rock arm 78 provides quick detachment of the chuck jaws 54a for maintenance or size change, and provides a safety feature, as will be presently described. Each rock arm 78 has two outwardly facing studs 79, each having enlarged heads or buttons.

The L-shaped jaw holders 49 have aligned, vertically elongated slots 80, each slot having an end enlargement 86. The main segment of slots 80 are slightly larger than the stud 79 diameter so as to allow sliding movement of studs 79 along slots 80. The end enlargement portion 86 permits passing the button end enlargement of studs 79 therethrough in quick assembly or disassembly of the holders 49 on the rock arms 78. Each rock arm 78 has a link 99 connected to it at an intermediate point by a pin 113. Link 99 is a part of the actuator assembly for the chuck shown on FIG. 10. Links 99 are pivotally attached at their inner ends to a hub 114 and the hub is connected securely to the lower end of the chuck actuator rod 36. Just above hub 114 is a center journal 115 that is integrally connected to the vertical leg members 46 by the bracket arm 116.

Figure 7:
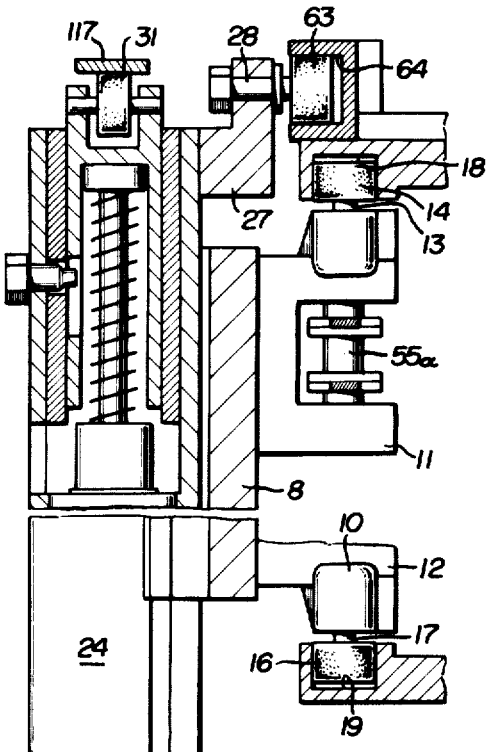
FIG. 7 is an elevational view, partly in section, showing the chuck apparatus of the invention at the loading station on the machine.
Figure 8:
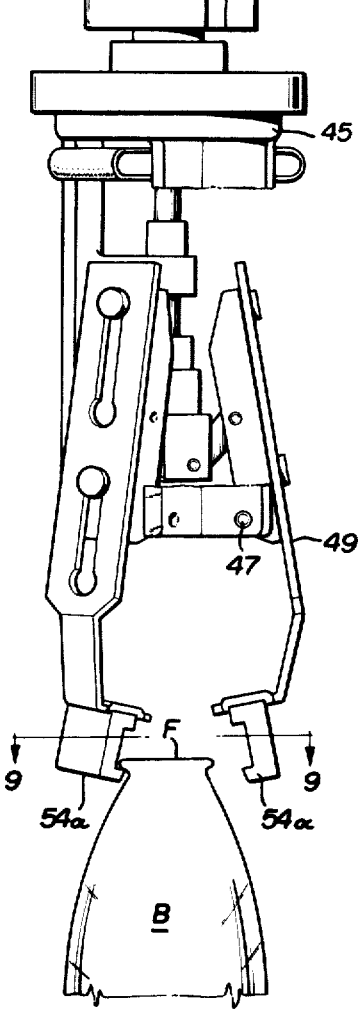
FIG. 8 is a side elevational view of the lower portion of the FIG. 7 apparatus illustrating a feature of the bottle chuck.
Figure 8:
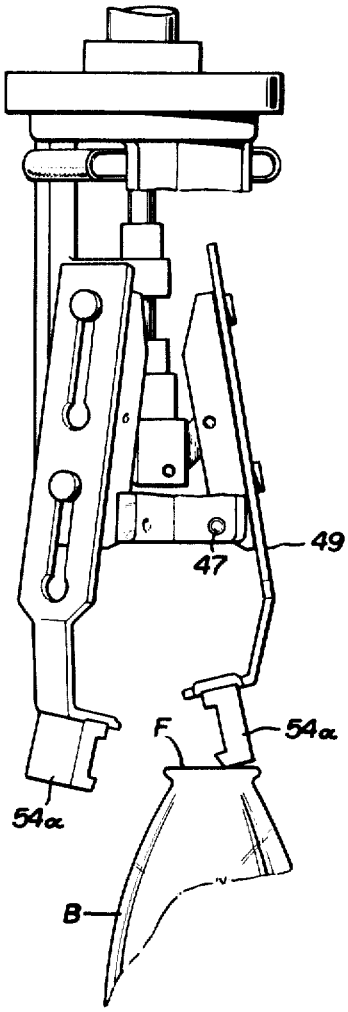
Figure 10:
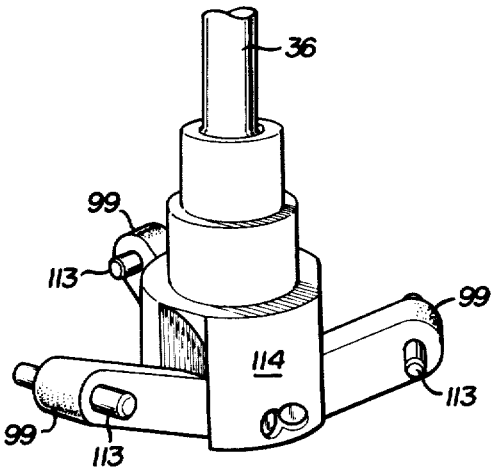
FIG. 10 is a perspective view of a portion of the bottle chuck of FIG. 7.
Figure 9:
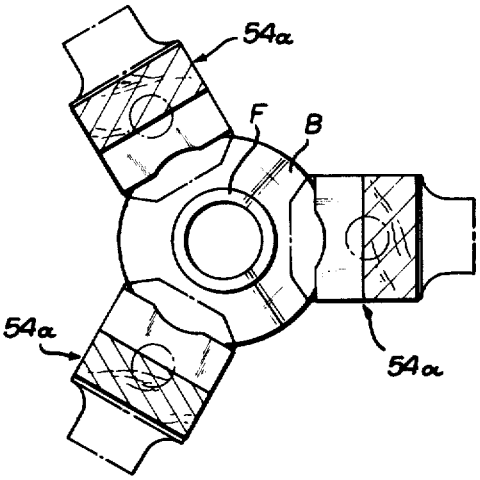
FIG. 9 is a sectional plan view taken along line 9—9 on FIG. 7.
Figure 11:
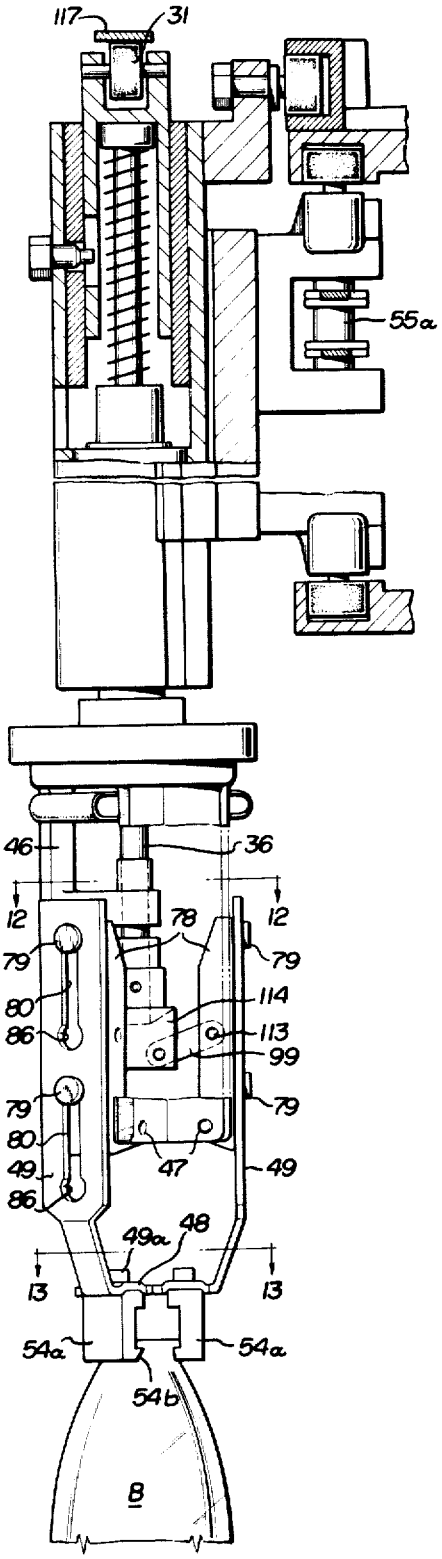
FIG. 11 is a side elevational view, partly in section, of the bottle chuck in its raised position for transporting a bottle on the machine.
Figure 12:
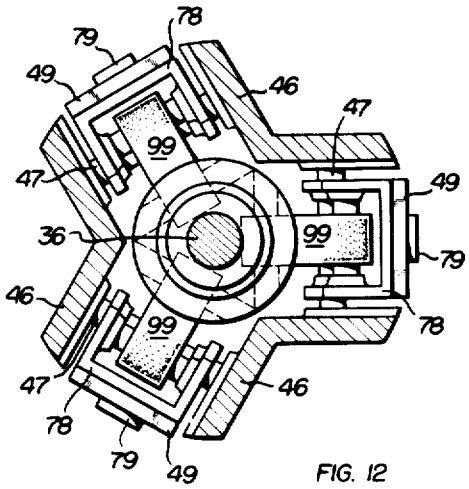
FIG. 12 is a sectional plan view taken along line 12—12 on FIG. 11.
Figure 13:
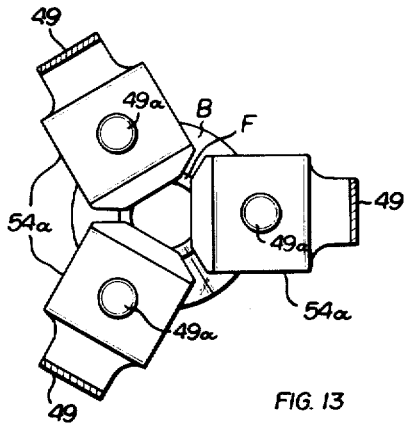
FIG. 13 is a sectional plan view taken along line 13—13 on FIG. 11.

Referring to FIGS. 7 and 11, the "open" and "closed" position of the chuck 54 are shown. In the "open" position (FIG. 7), cam roller 31 is engaged on cam 117 shifting piston 30 and actuator rod 36 downwardly further compressing spring 42. The downward movement of rod 36 lowers hub 114 causing rock arms 78 to pivot inwardly about the end pin 47. On FIG. 7, the right-hand rock arm rocks in a counterclockwise direction about pin 47. Rocking arms 78 in this fashion moves the jaws 54a of the chuck away from the center or axis and "opens" them with respect to the finish F of the underlying bottle B. The jaws 54a are "closed" by the reverse reciprocal movement of rod 36 under raised contour of cam 117 and spring 42. This is shown on FIG. 11. The upward movement of the hub 114 pivots rock arms 78 to close the chuck and the lower radial ledge 54b of each jaw 54a closes under the finish bead of the bottle B. The bottle is then held and suspended by the bead finish F engaged by the three jaws at their ledge 54b.

LOADING STATION

Referring to FIG. 4, the bottles are loaded to the handling apparatus by the combined timing of the bottles on the conveyor 52 by the worm 53, the manipulation of the elevation of the chucks 54 by the cam tracks 64, and operation of the jaws of the chucks by the chuck cam 117. As the bottle B leaves the timing worm 53 advancing left to right on FIG. 4, the chuck is over the bottle and moving at the same speed in that direction. Cam 64 then slopes downwardly so as to drive the chuck cylinder 24 (FIG. 7) downwardly. The jaws of chuck 54 are simultaneously held open by a cam 117 through this same span of travel until the jaws 54a of the chuck surround the botte finish F. At this point, the contour of cam 117 rises abruptly and spring 42 closes the chuck jaws as shown on FIG. 11. Thereafter the cam track portion 46b (FIG. 4) raises. The chuck assembly 54 and bottle B held thereby is raised from the conveyor 52.

The just described operation provides for engaging bottles by the handling apparatus if the bottles are substantially centered under the chuck jaws. Some misalignment of the circumference of finish F is permissible with this apparatus and the bottle will be picked up from the conveyor, that is, the axial center of the bottle and the axial center of the chuck at the time the bottle is picked up need not be exactly centered and aligned. The tolerance allowable for a successful engagement of the bottle is summarized as follows: If the perimeter of the finish bead of the bottle is within the inner circular confine of the lip 54b of the jaws while in open position, though off of center, the jaws upon closing will move the bottle into chucked position as the jaws close. This is illustrated on FIG. 7. On the other hand, if the bottle is seriously misaligned with the chuck so that the perimeter of the bead finish is outside the inner circle prescribed by the gripping lip 54b, the bottle will not be picked up. A jam-up or breakage of the bottle in this latter situation is avoided by the unique structure of the chuck. As the chuck assembly is lowered by track 64 and a jaw 54a is moved into an interference engagement with the top of the bottle, such as in FIG. 8, the mounting of holder 49 on its rock arm 78 permits jaw 54a to yield upwardly by virtue of holder 49 being relatively freely slidable upon the rock arm 78 along the slots 80. The studs 79 retain and guide holder 49 along these slots. Since the bottle in this case will not be engaged by the chuck 54 to be picked up, the conveyor 52 (FIG. 4) will dump the misaligned bottle off the end of conveyor 52 into a suitable receptacle (not shown).

The linear spacing between axial centers of the successive chucks 54 (e.g., see FIG. 5) is equal and this spacing is also equal to the spacing between vertical centers of the sleeve forming mandrels 66 on the turret mechanism, to be presently described. The infeed worm 53 has a pitch that will provide spacing of the successive containers B on conveyor 52 equal to the center-to-center spacing of successive chucks 54. Speed synchronization of worm 53 with linear speed of conveyor chains 55 and conveyor 52 is provided by a synchronous drive and phase synchronization and adjustment of worm 53 is achieved by a known PVI unit (not shown) in the drive to the worm. By this means, the ware phase spacing on the conveyor may be timed with the chucks. The motor drive 61 that is connected to operate the chains 55, conveyor 52 and worm 53 is electrically synchronized with the drive transmission for the sleeve making turret 67, to be presently described.

SLEEVE MAKING MACHINE

The machine 68 for making the plastic sleeves has been described somewhat generally in the foregoing. A more vivid description follows with reference to FIGS. 3 and 14–25.

WEB HANDLING AND FEED

Figure 3:
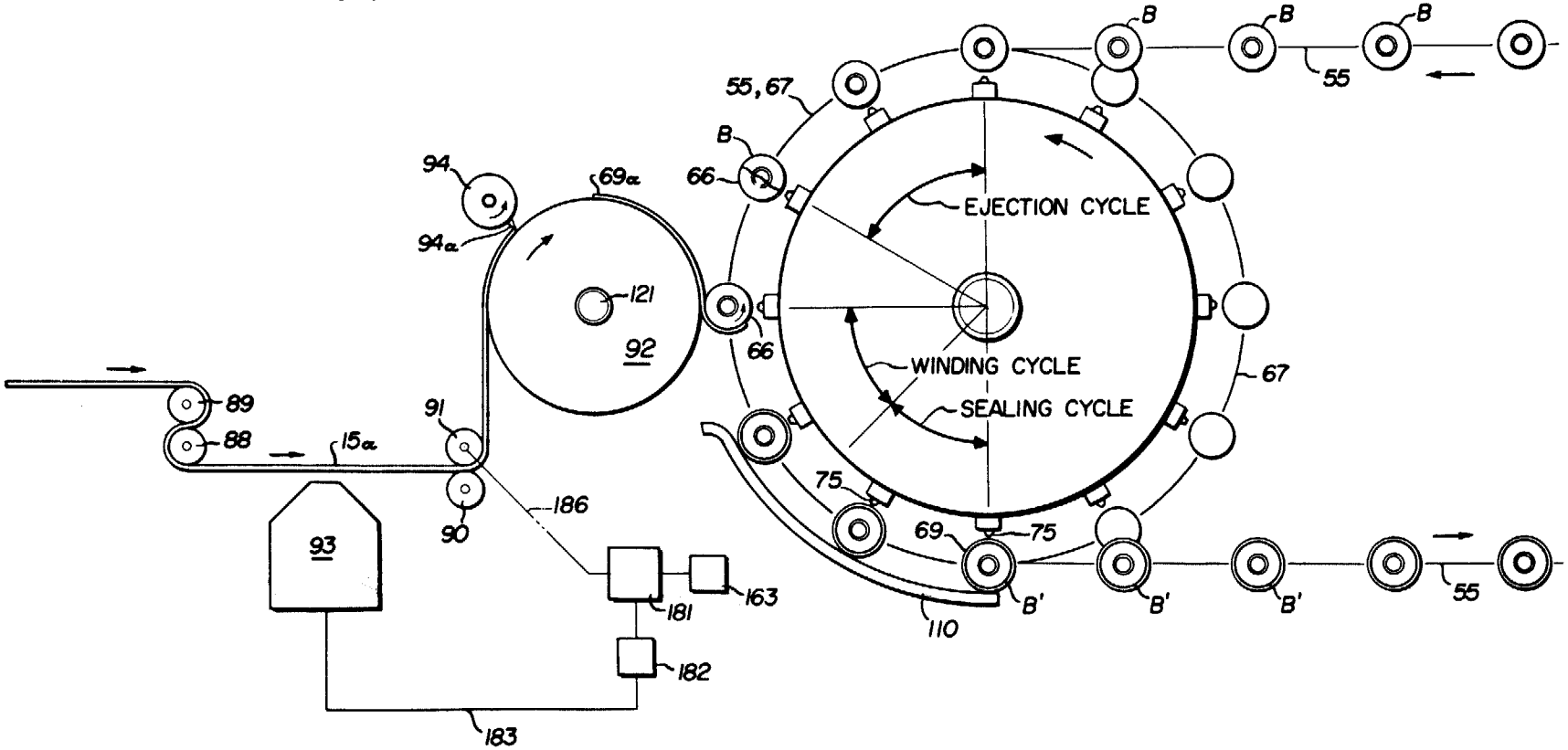
FIG. 3 is a plan view, somewhat schematic, of the machine for sizing the plastic, wrapping and seaming a sleeve therefrom and assembly onto a bottle.
Figure 19:
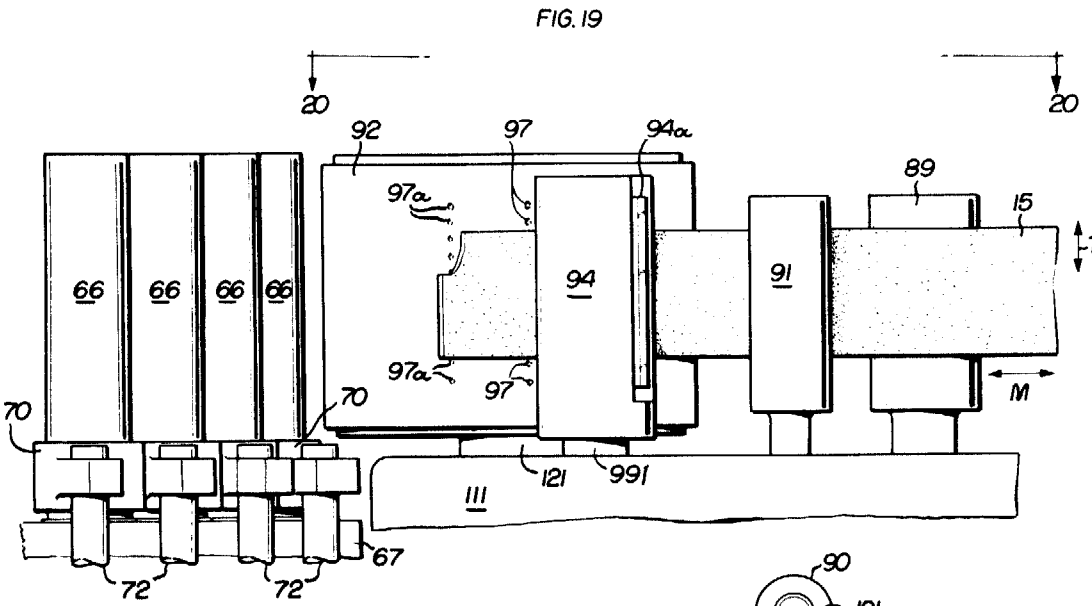
FIG. 19 is a side elevational view of the plastic strip feed apparatus and the sleeve making turret.
Figure 20:
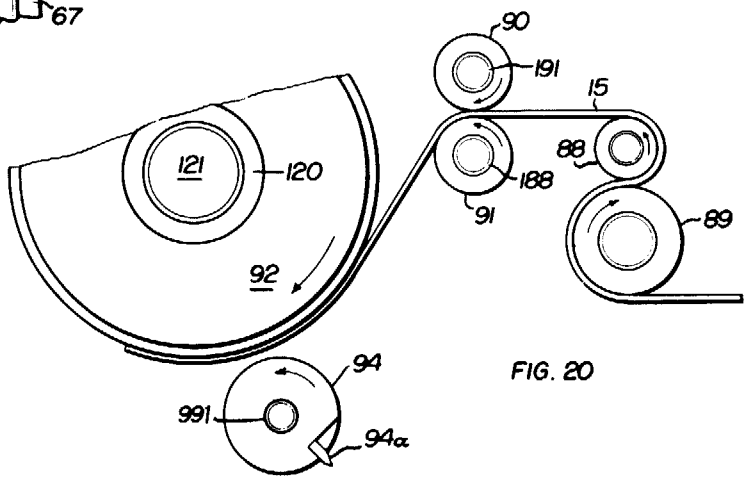
FIG. 20 is a top plan view of the plastic strip feed apparatus for forming blanks and delivery thereof to the sleeve making turret.

The plastic strip stock 15 is supplied in rolls 15a (FIG. 1) which are supported on rotary stand 87 with the decorated surface facing either direction. As shown on the drawing, the rolls of stock are on a horizontal axis for unwinding, in which case a twist is placed in the web before the S-wrap guide 88, 89 (FIG. 20) so that the decorated surface faces inwardly as the strip passes over roll 89. As the strip stock is fed through S-wrap guide 88, 89, the strip of plastic is advanced in a vertical position. As best shown on FIGS. 19, 20 and 3, the strip next passes between the pair of feed rollers 90, 91 and onto the feed drum 92. The strip goes onto feed drum 92 with the printed side facing inwardly on that drum. Between S-wrap 88, 89 and the pair of rollers 90, 91 is a photocell registration unit 93 that maintains the linear relationship of the repetitive decoration in the strip relative to the rotary cutoff knife 94. Referring to FIGS. 19, 20 and 3, the continuous pull of the feed rollers 90, 91 controls movement of the strip onto feed drum 92. Rollers 90, 91 are continuously driven from a drive connection 112 through a differential mechanism 95 powered by an electrical motor 96.

Figure 17:
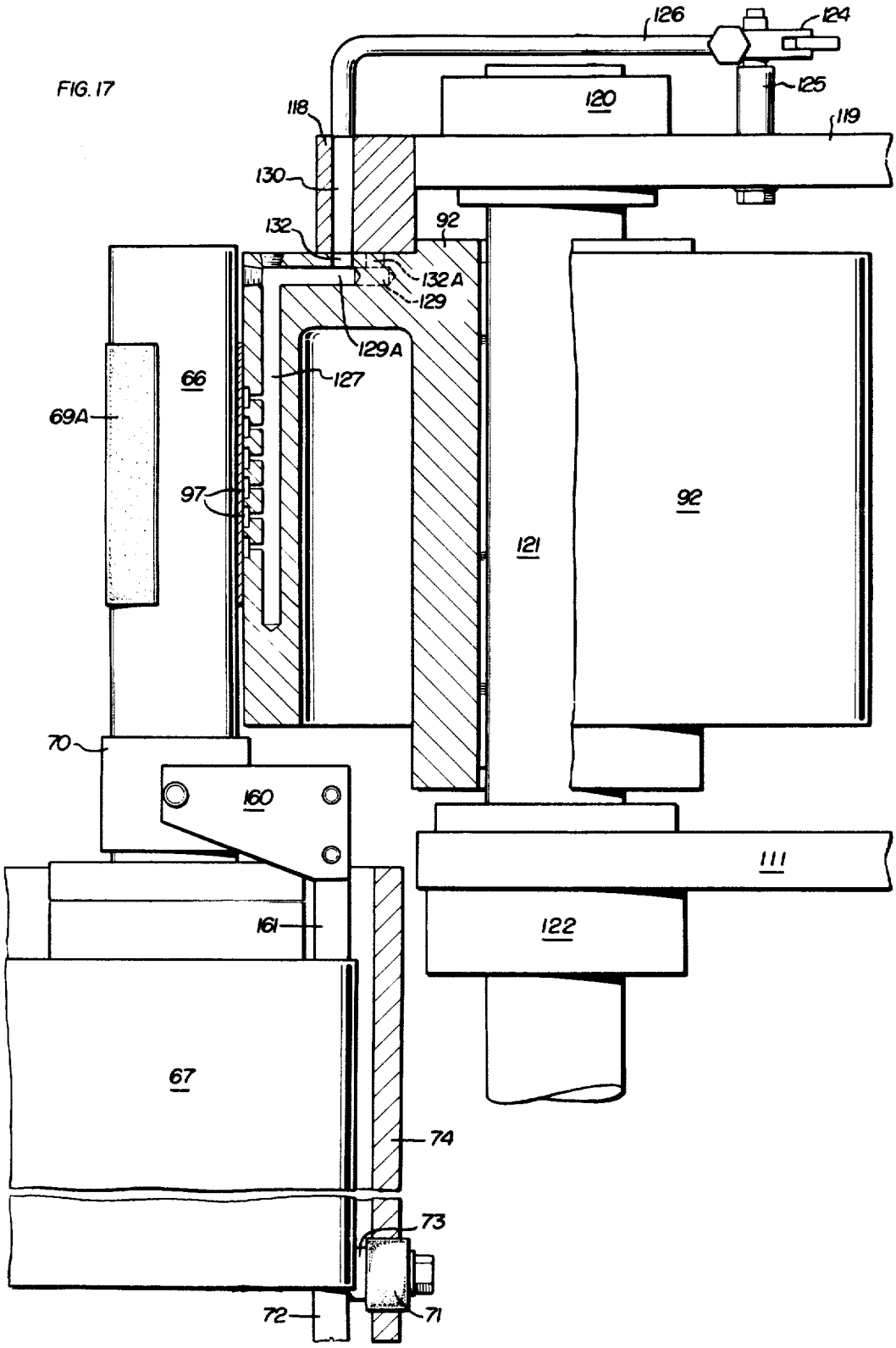
FIG. 17 is a sectional elevational view of the plastic strip transfer device and a mandrel of the plastic sleeve making turret.
Figure 17A:
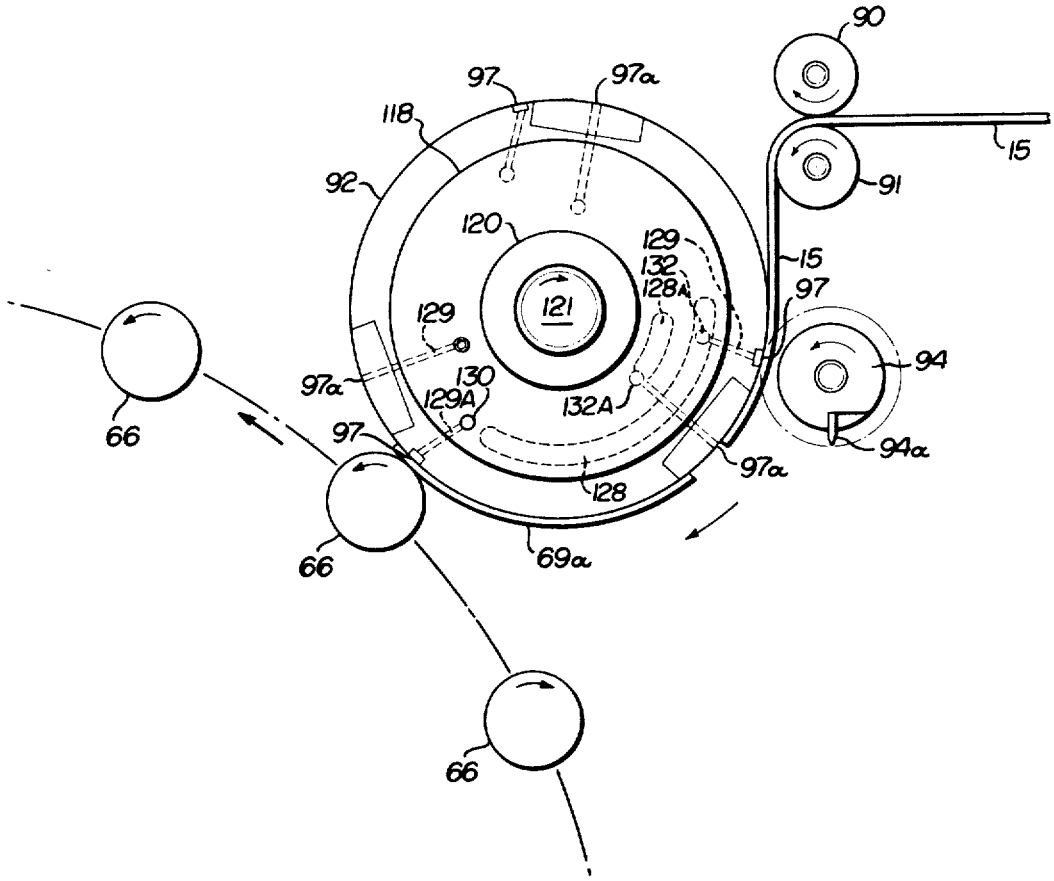
FIG. 17A is a partially schematic, sectional plan view of the plastic feed drum and mandrel interface, illustrating cutting the blank lengths of plastic and feeding them onto the turret mandrels.
Figure 17B:
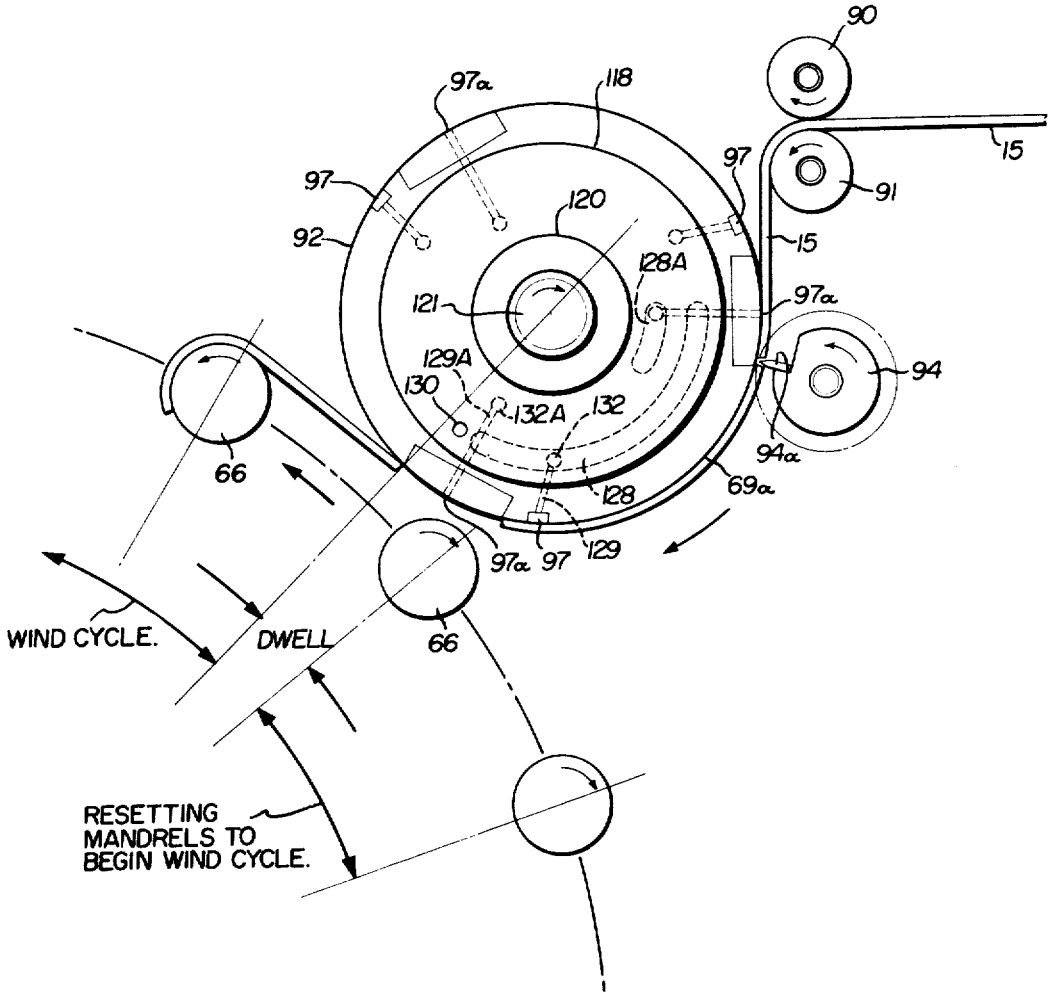
FIG. 17B is a further view like FIG. 17A showing an advanced stage of the feed drum and mandrels at the time the blank is cut from the web stock of plastic material.

After the strip passes through feed rollers 90, 91 the leading portion of the strip is held against the vertical cylindrical face of the feed drum 92 by vacuum applied through the vertically arranged series (row) of ports 97 and 97A (FIG. 17). Around the periphery of drum 92 are three equally spaced-apart sets of ports, each such set being comprised of ports 97 and 97A (FIG. 17A). Vacuum is applied through a stationary top manifold block 118 connected with the upper frame 119. The upper frame 119 supports a journal bearing 120 for the vertical shaft 121 and feed drum 92 is keyed onto shaft 121. The manifold block 118 is circular extending around the shaft 121. A lower journal bearing 122 is supported by the lower frame member 111.

The vacuum is connected from a suitable source to two arcuately arranged chambers, which are provided in the vacuum manifold block 118 (FIG. 17A). The shorter arcuate chamber 128A, extending approximately 20°, connects into a short vertical passage connected into a lateral passage 129 of the feed drum 92; and in turn is connected to a vertical passage like 127 which connects with the vertically arranged series of ports 97A in the vertical cylindrical face of the feed drum 92. The ports 97A are in contact with the leading end of web 15 just as the previous blank is cut by the rotary knife 94A; and thereby controls the leading edge of the web to hold it onto drum 92 after the knife severs the material.

The longer arcuate chamber 128 extending approximately 135°, connects into a short vertical passage 1321 connected with the lateral passage 129A of the feed drum 92, and in turn is connected to vertical passage 127, which connects with the vertically arranged series of ports 97 in the cylindrical face of the feed drum 92. The ports 97 are in contact with the web 15 previous to cutting the material and exerts a pulling force in web 15 to keep the material taut between the rolls 90, 91 and drum 92. Drum 92 has a higher periphery velocity than the material fed by rolls 90, 91.

When the rotary knife 94A has completed its cutting action against the vertical face of the feed drum 92, the series of ports 97A will apply a vacuum to the web 15 at the interface with the drum as the lateral passage 129 is connected by 132A entering the vacuum chamber 128A of the vacuum manifold block 118. The difference in surface speed between the drum 92 and the web 15 will generate a slip clutch effect between the vertical face of the drum 92, the ports 97, 97A and the web 15. This slip clutch effect may be seen on FIG. 17A noting the relative position of the ports 97A and 97, respectively, to the leading edge of the material at the knife (near the 4 o'clock position on FIG. 17A) and the ports 97A and 97, respectively, to the leading edge of blank 69a at the mandrel 66 (near the 7 o'clock position on FIG. 17A). This slip clutch effect will cause the vertical ports 97A to advance on the leading edge of the web 15 and subsequently lose contact. Before this occurs, the vertical ports 97 will have engaged the web 15 and the lateral passage 129A is connected by 132 traversing the vacuum chamber 128 of the vacuum manifold block 118 which will apply a vacuum at the interface of the drum 92 and the web 15, thereby maintaining a continuity of the slip clutch effect between the drum 92, the web 15 and the ports 97. After the cut by knife 94A, the blank 69a of material assumes the velocity of the drum surface. This causes the gap to occur between the trailing edge of blank 69a and the leading edge of web 15 providing the timing of the successive blanks 69a and mandrels 66. The slip clutch effect, just described, that occurs between the drum 92 and web 15 applies a tension to the material between the drum 92 and feed rolls 90, 91 and holds the web taut therebetween. The feed rolls meter out the proper amount of material for the length of sleeve blank being run on the turret. Holding the web under tension omits buckling of the web as it is emitted from the exit side of the feed rolls. The tension applied is such that it will not overcome the pressure of the feed rolls and pull an excessive amount of material (length) through the rolls.

The vacuum ports 97 continue the slip clutch effect with the material until the ports 97 register to the desired relationship with the leading edge of the web. When this condition is established, the rotary knife 94a will advance to cut the web and that portion that is severed—now referred to as sleeve blank 69a—and in register will attain the speed of the surface of drum 92, i.e., the vacuum will firmly hold blank 69a on the surface of the drum 92 without slip.

With the severed blank 69a connected with vacuum at ports 97, feed drum 92 continues to rotate reaching a position of closest tangential proximity with a winding mandrel 66. At this point the leading vacuum ports 97 are no longer connected with manifold 128, but vertical passage 1321 now connects with a staionary air manifold 130 in the manifold block 118. The air manifold 130 is a relatively small section and passage 1321 is connected with manifold 130 only momentarily. This provides a short puff of positive air pressure through ports 97 and releases the leading end of blank 69a from drum 92.

The air pressure is connected from a suitable source by conduit to a valve 124 supported on the frame by bolt 125. A conduit extends from the outlet side of valve 124 into the manifold 130. A cam 124B (shown on FIG. 18) is mounted on the knife shaft 991 and rotates therewith. For every revolution of shaft 991 cam 124B operates the valve 124 in timed relationship with passage 1321 traversing the manifold 130.

As mentioned, drum 92 has a peripheral speed slightly faster than the feed rollers 90, 91 move the strip. With the vacuum on the strip, it is carried to the knife 94a and a small amount of slippage between the strip and drum 92 occurs. This keeps strip 15a taut—but after the cut is made by knife 94a, the trailing edge of the cut strip accelerates to space it from the front edge of the next blank. The successive blanks are thereby spaced apart in series. The periphery of drum 92 is in close tangential proximity to the peripheral surface of mandrels 66 at the transfer interface as they are moved past the drum by rotary turret 67. The clearance between the mandrel surface and feed drum surface is about 1½ times the thickness of the strip 15a. When, during rotation of turret 67, a transfer interface occurs where the center axis of the mandrel 66 coincides with the diametrical line connection between the rotary centers of the turret 67 and drum 92, the plastic blank 69a is transferred from the feed drum onto the mandrel 66.

MANDREL MECHANISM

Figure 22:
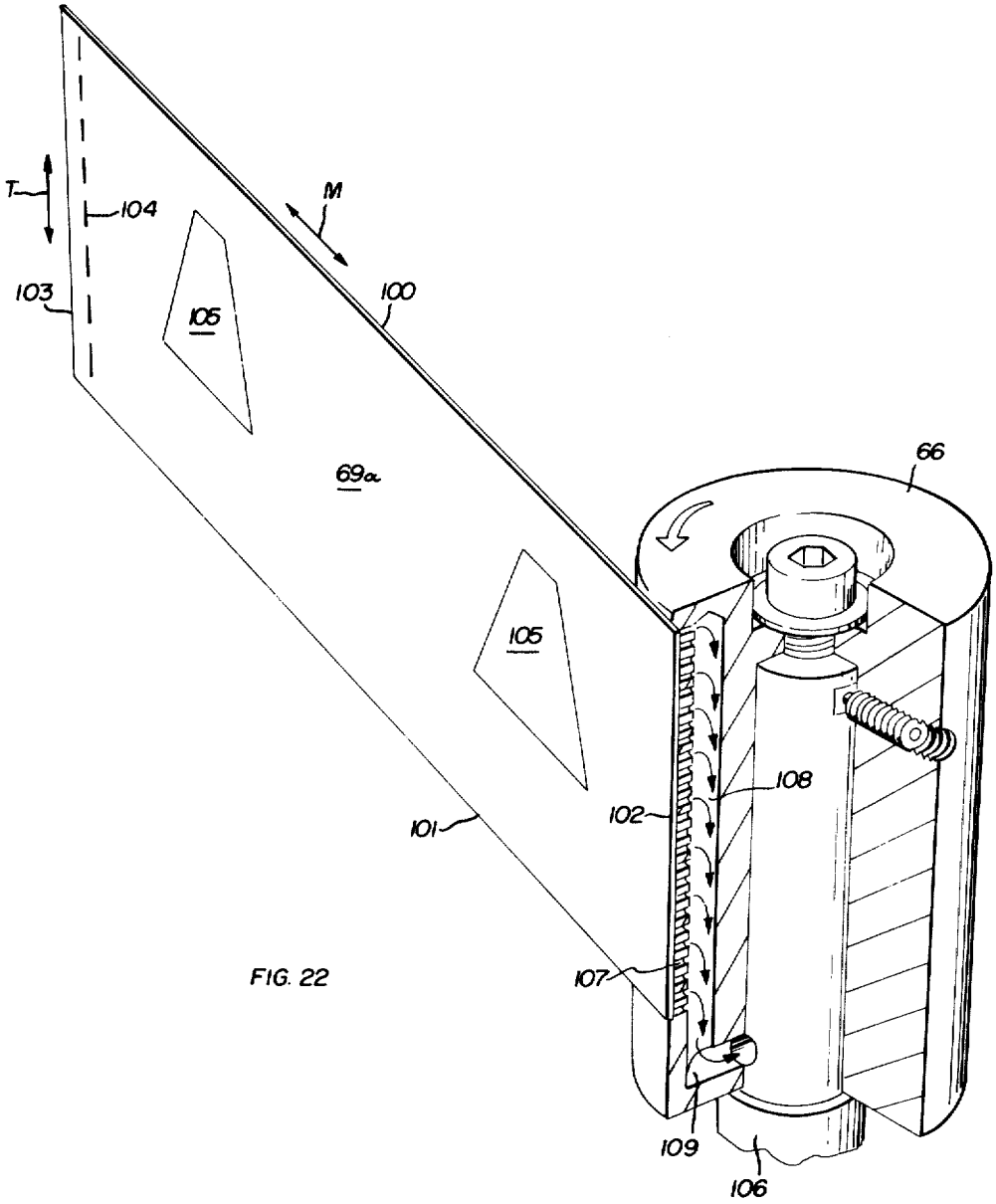
FIG. 22 is a spatial perspective, somewhat schematic view of a mandrel of the plastic sleeve forming turret.

This transfer attachment of blank 69a is schematically illustrated on FIG. 22. Mandrel 66 is rotatably mounted on the turret by the vertical rotary shaft 106 (FIG. 15) which controls the rotation of the mandrel about its own axis. Along the periphery of the mandrel are several vertically arranged vacuum ports 107 (FIG. 22) receiving vacuum through the internal chamber 108. A connection is made to a vacuum source through radial port 109 and the vertical passage 197 in shaft 106 (FIG. 15A).

Figure 15:
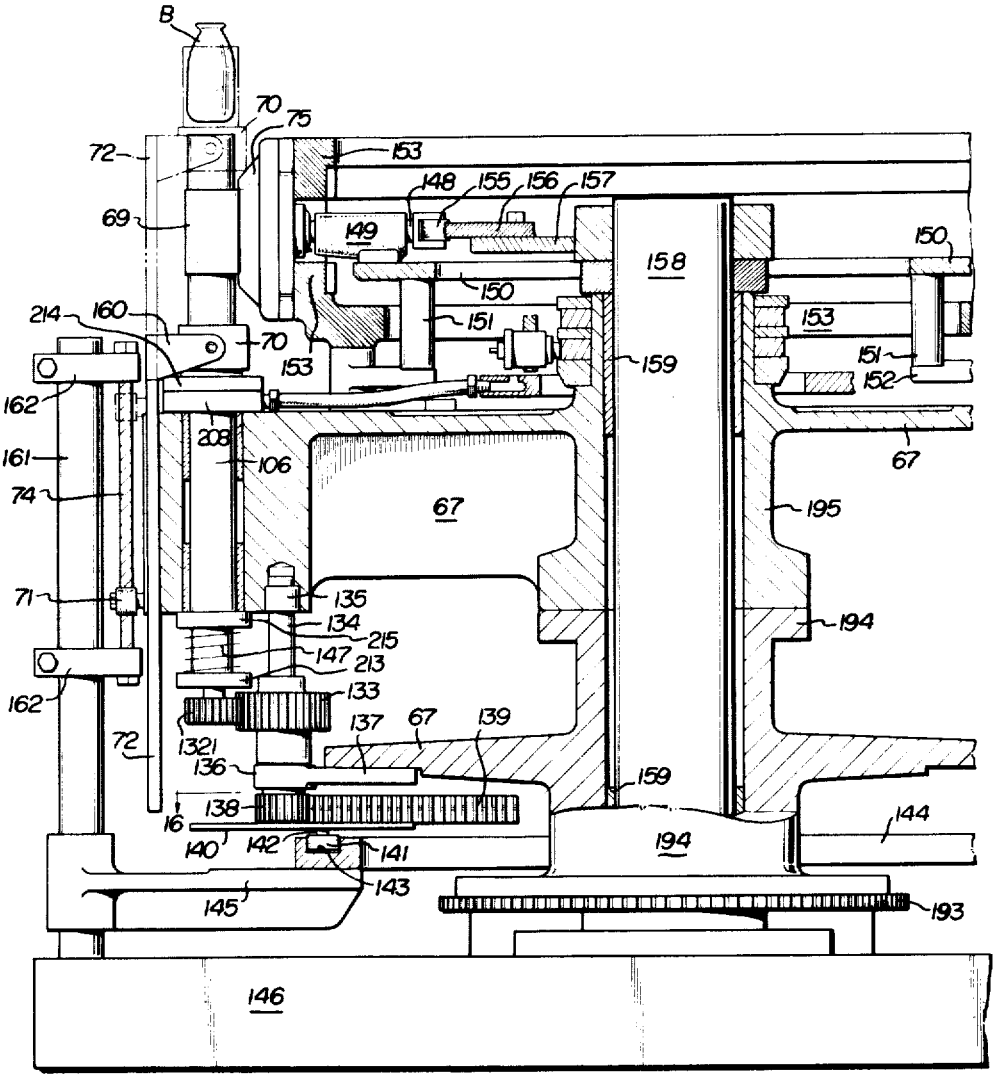
FIG. 15 is a sectional elevational view taken along line 15—15 on FIG. 14.
Figure 15A:
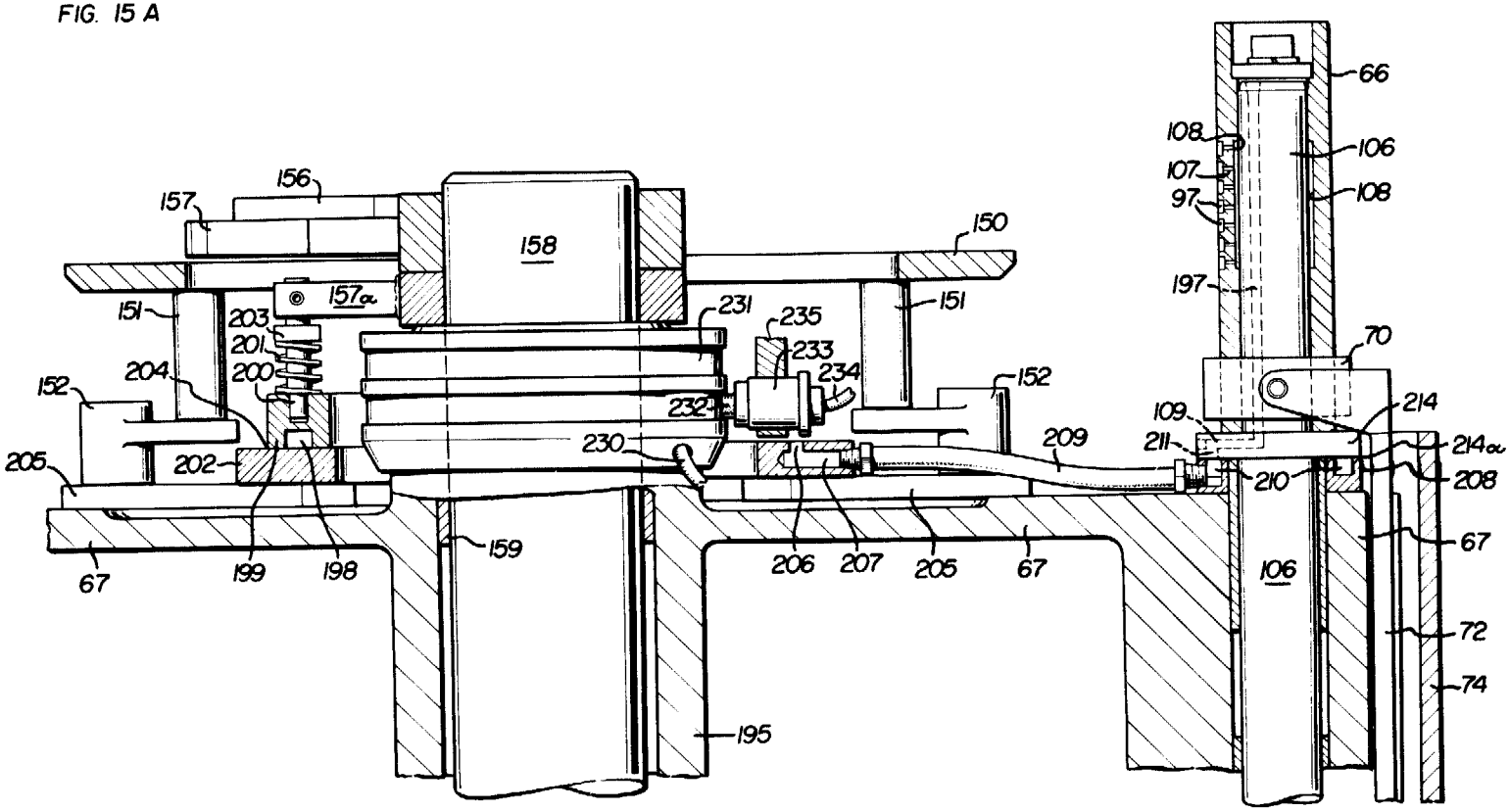
FIG. 15A is a partial sectional elevational view of the turret machine, including the mandrel vacuum system.
Figure 15B:
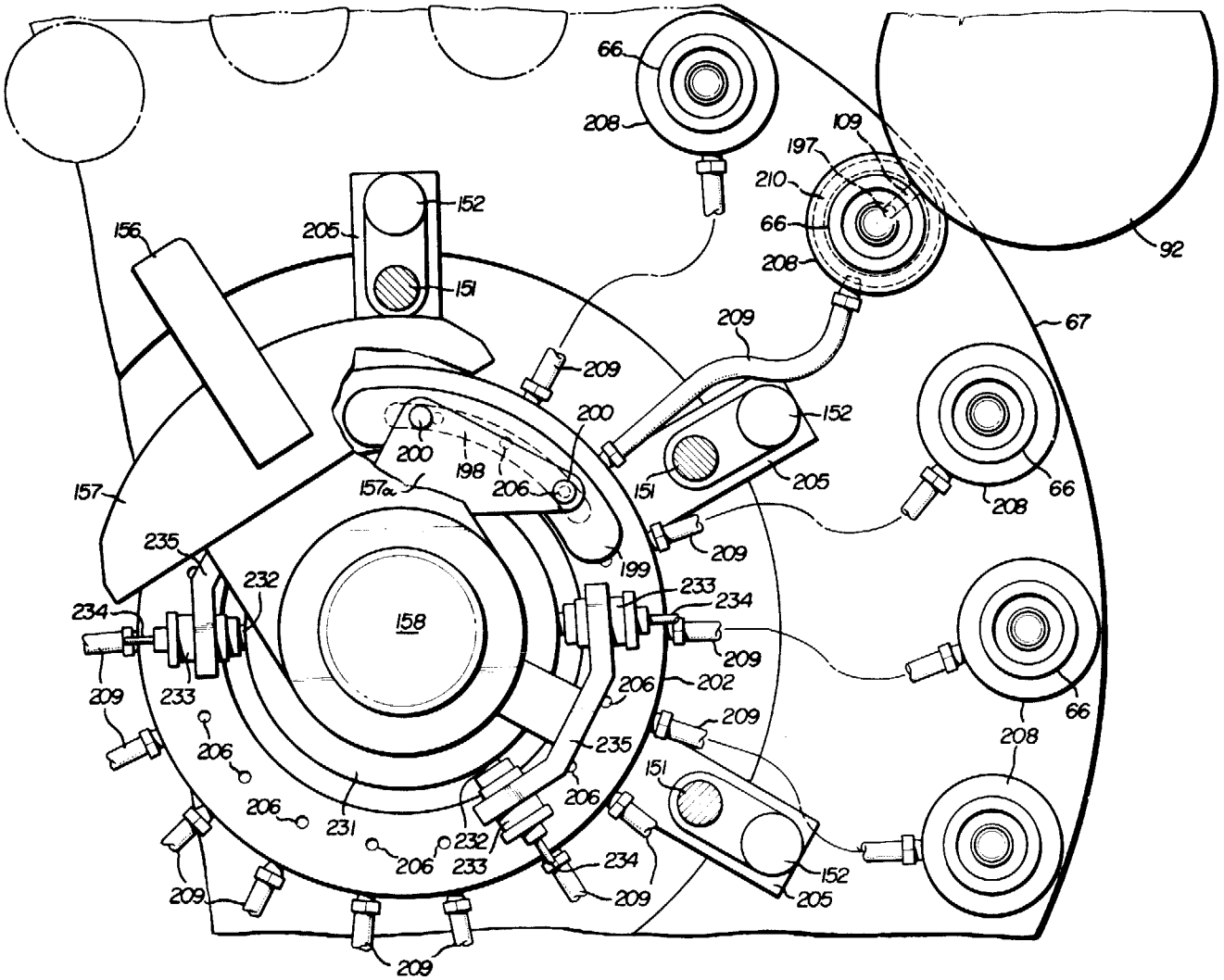
FIG. 15B is a partial plan view of the turret machine shown on FIG. 14.

The vacuum is connected from a suitable source to an arcuately arranged vacuum chamber 198 provided in the manifold block 199 (FIGS. 15A, 15B). The chamber 198 extends through an arc of approximately 55° which allows vacuum at the mandrel port 107 to be effective for transfer of the blank 69a 10° previous to the time the mandrel 66 reaches the tangential intersection with the drum 92 to 10° after the winding cycle of 45° has been completed (FIGS. 3 and 15B). The vacuum manifold 199 is held stationary with respect to the rotating turret 67 by the stud 200 fastened to the hub 157 supported by the vertical stationary column 158. The manifold 199 is vertically slidable on stud 200 and is held in a downward position by the pressure of spring 201 bearing against rotatable orifice plate 202 moving with turret 67. The collar 203 threaded on the upper stud 200 provides a means of adjusting the spring pressure between the manifold 199 and the orifice plate 202 to maintain a seal for the vacuum at the sliding interface 204 between the manifold 199 and the plate 202. The rotatable orifice plate is fastened to the turret 67 by means of a multiplicity of support arms 205 clamped under brackets 152 spaced around turret 67. Orifice plate 202 has a port 206 for each of the several mandrels 66. A horizontal passage 207 connects port 206 and the mandrel base collar 208 by a tube 209. Vacuum may flow from the orifice 206 to the annular chamber 210 in the mandrel base collar 208 in the rotary segment whereat vacuum chamber 198 and orifice 206 are connected. The base collar 208 provides vertical support for the mandrel at flange 214 and mandrel 66 is rotatable with respect to collar 208 at the radial bearing surface 214A. Base collar 208 is fixed to the turret 67. A vertical passage 211 connects with horizontal passage 109 in the flange 214. Annular chamber 210 around collar 208 provides a continuous connection for vacuum during the 540° winding cycle of the mandrel 66. The spring 147 (FIG. 15) exerts a downward axial force against the collar 213 fastened to the shaft 106 to effect an air seal at the interface 214.

The thrust bearing 215 (FIG. 15B) omits the friction between the spring 147 and the turret 67 during the winding cycles of the shaft 106. As each orifice 206 (FIGS. 15A and 15B) traverses the arcuate vacuum chamber 198 vacuum is supplied to the mandrel through the arcuate travel of the mandrel and turret during which the mandrel performs its winding cycle.

Figure 23:
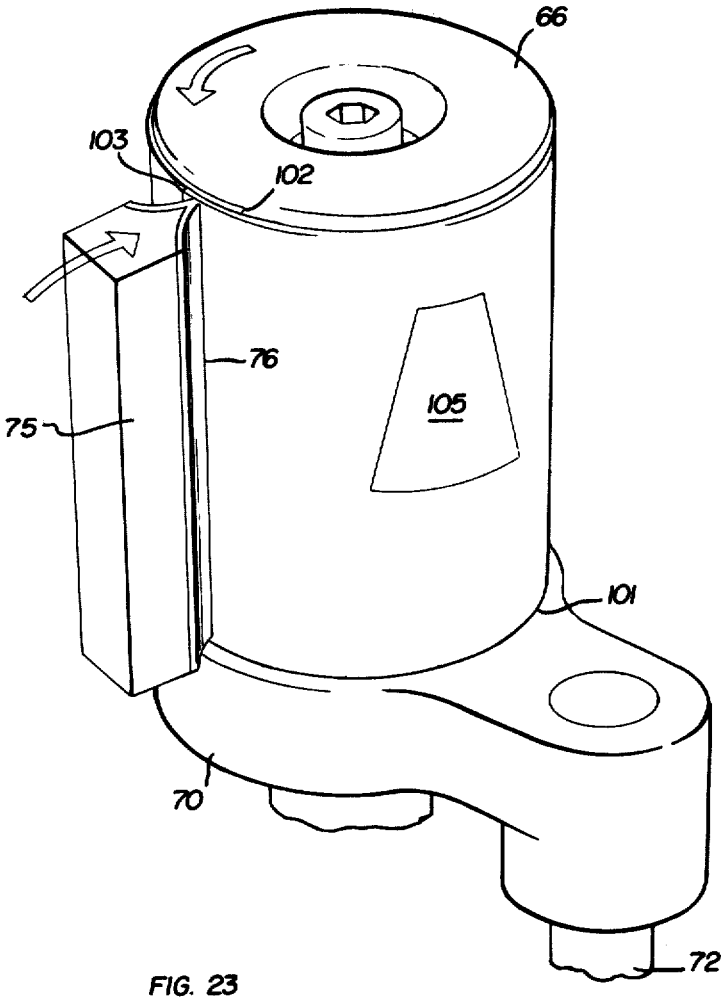
FIG. 23 is a spatial perspective, somewhat schematic view of the mandrel of FIG. 22 and the sealing device for seaming a plastic sleeve thereon.

Although only one row of vacuum ports 107 is shown on mandrel 66, several rows may be utilized. As the leading end of sleeve blank 69a covers the ports 107 of the mandrel, vacuum will hold the blank on the mandrel. The mandrel is then at the biginning of the winding cycle during the turret rotation, and through cam-operated gearing (to be described hereinafter) connected to the shaft 106 in the turret, mandrel 66 is rotated counter-clockwise (FIG. 22) 540°, or 1½ revolutions during the winding cycle. The blank 69a is wrapped on the mandrel such that the trailing edge 103 of the blank overlaps the leading edge 102 to the dashed line reference 104 (FIGS. 22 and 23). During the rotation of the mandrel in its winding cycle, the plastic blank 69a is held against the mandrel by the stationary winding plate 110 which is supported on the frame 111 of the strip feed machine (FIGS. 19 and 3). Adjustable pressure of winding plate 110 maintains a tight wrap of the plastic strip on the mandrel.

Referring to FIGS. 3, 14, 15 and 16, a mandrel drive means for rotating the mandrels in successin includes a gear 1321 connected as the driver on the lower end of shaft 106. Gear 1321 meshes with gear 133. A vertical shaft 134 has a bearing 135 in the turret 67 and a bearing 136 in bracket 137 supports gear 133 for rotation. A drive pinion 138 is keyed on the end of shaft 134 extending below bearing 136 and in mesh with rack gear segment 139. Rack gear 139 is shown radially mounted in housing 140 on turret 67 and carries rotatable cam roller 141 attached to the underside of gear segment 139 at pin 142. Rack gear 139 is shown as a straight gear segment; however, an arcuate gear segment pivotally mounted on turret 67 and carrying a roller 141 may be used satisfactorily. Either element is known in mechanical arts.

Roller 141 travels in cam groove 143 formed at the top surface of stationary cam plate 144 and defines an endless cam path about the turret 67. Cam plate 144 is rigidly held on arms 145 attached to the base platform 146 of the turret mechanism at spaced intervals about turret 67 by vertical support posts 161 (see FIGS. 14 and 15).

Figure 16:
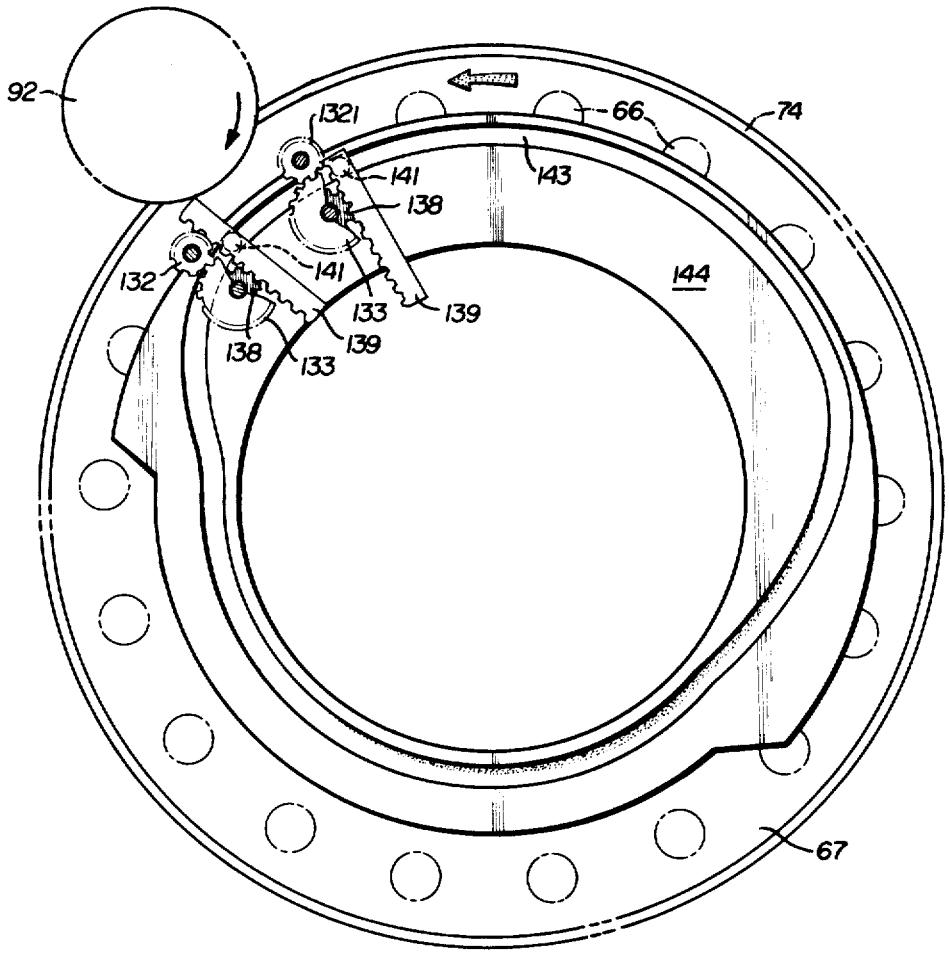
FIG. 16 is a top plan view of an under portion of the turret machine for making the plastic sleeves.

With momentary reference to FIGS. 3, 15B and 16, the mandrel winding cycle begins adjacent to the near tangential intersection of the plastic blank on feed drum 92 and a mandrel peripheral surface. The ports 107 on FIG. 22 are radially disposed on the mandrel peripheral surface so as to face the tangential intersection of the plastic blank 69a on the feed drum 92. In this position, the mandrel is set for beginning its winding cycle. As the cam rollers 141 approach beginning the winding cycle, cam 143 has a constant radius from column 158. At the beginning of rotation of the mandrel, the radius of cam groove 143 decreases which carries rack gear 139 radially inwardly. This movement imparts rotation to pinion 138 and gear 133, which in turn drives gear 1321 on the lower shaft 106 of mandrel 66. The ratio of gearing is such that the mandrel in the winding cycle will rotate counter-clockwise through 540°. This is achieved when the cam radius has decreased to its lowest extent.

The 540° of rotation (1½ revolutions) imparted to each mandrel 66 is designed to advance the leading edge 102 of a blank 69a attached by vacuum at ports 107 from the radially outward peripheral position disposed opposite a heat sealing bar 75. The 540° (1½ revolutions) automatically disposes the trailing edge 103 of blank 69a in an overlap relationship with the leading edge 102 as shown in FIG. 22.

After the winding cycle, cam 143 has a constant radius "dwell" segment extending until the mandrel will again begin its approach to the tangential interface with the feed drum; and next, a gradual rise in the cam will reset the rotational position of mandrel 66 for receiving the next blank 69a. Just prior to this next winding cycle, mandrel 66 is held by a "dwell" in the cam 143; thereafter repeating the decreasing radius segment of the cam for performing the winding operation of the mandrel, above described.

The individual sealing bars 75 for each mandrel are located on the radius of the turret intersecting the mandrel center aixs, and 540° of rotation of mandrel 66 places the ovrlapped ends of the plastic opposite the sealing bar (see FIG. 23). After the winding cycle, the next segment of turret operation performs the sealing cycle in which the sealing bar 75 is extended to enagage its heated tip 76 on the overlap seam area to apply heat and pressure, thereby seaming a cylindrical sleeve 69 on the mandrel (see FIGS. 21 and 23).

The sealing bars 75 are mounted around the turret 67 so that a bar 75 is opposite each mandrel 66. Bar 75 is on a radius of the turret and reciprocates in a horizontal plane that extends through the center of rotation of the mandrel. At the time the mandrel 66 and feed drum 92 strike a tangent relationship (FIGS. 3 and 14), the sealing bar 75 is 180° opposite this tangent point. This is at the beginning of the winding cycle whereat the sealing bar 75 is radially retracted. The sealing bars 75 are attached to a piston rod 148 extending through a cylinder 149 attached to a support ring 150. Support ring 150 is attached to turret 67 by columns 151 and brackets 152, as shown in FIG. 15. Also supported on turret 67 is a heat source mechanism. This comprises a ring-shaped heat source 153 electrically powered by resistance heater units therein. The piston rod 148 is spring loaded (not shown) inside the cylinder 149 to normally urge piston rod 148 radially inwardly (or, to the right on FIG. 15), and this retracts sealing bar 75 so that it is stopped in contact with outwardly facing surface of the ring-shaped heat source 153. Electric current is carried to the heat source 153 by conductors 234 extending to a commutator assembly 231 attached on the base column 158 of the turret machine (FIGS. 15A and 15B). Power is transmitted to the stationary commutator ring 231 by the conductor 230. Brushes 232 run on ring 231 and transfer power through junction assembly 233 wherein the conductors 234 are attached to brushes 232. Assembly 233 is attached to turret 67 to move therewith by the hanger brackets 235. Although this is not shown in further detail on the drawings, such connections are commonplace and well understood by those skilled in the art; therefore, a further precise illustration and description is believed unnnecessary. The inner end of piston rod 148 has a rotatable cam roller 155 running on the vertical face of a lateral cam 156. Cam 56 is stationary and is fastened by a hub 157 on the vertical stationary column (shaft) 158 of the turret machine. As shown in FIG. 15, turret 67 is bearing mounted at 159 for rotation about column 158.

Figure 14:
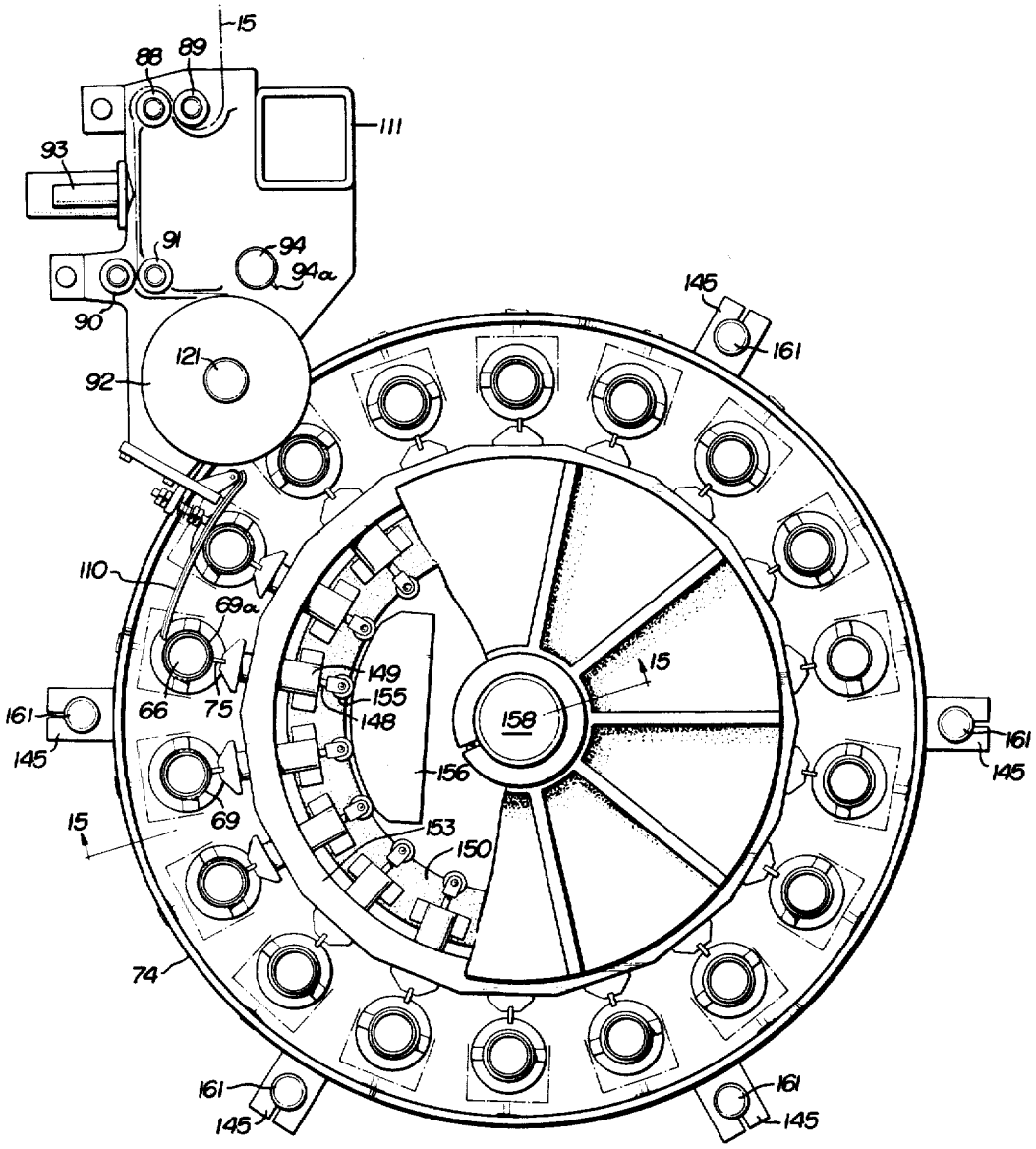
FIG. 14 is a plan view of the plastic sleeve making turret that is rotatable about about a vertical axis that is common with one end axis for rotation of the bottle handling apparatus.

As may be seen on FIG. 14, cam 156 extends circumferentially of turret 67 through an arc of travel spanning the sealing cycle (FIG. 3). Accordingly, roller 155 engages cam 156 while the mandrels 66 move along winding plate 110 and just as the mandrel has commpleted its 1½ revolutions at the end of the winding cycle. The cam extends piston rod 148 and engages sealing bar 75 with the overlapped ends of the blank 69a. The heat and radial pressure of sealing bar 75 against the lapped ends of the plastic on mandrel 66 forms a vertical or co-axial seam on the wound plastic. This makes the blank into a lap-seamed sleeve 69. After the sealing cycle is completed, roller 155 runs off cam 156 and the spring loading of cylinder 149 returns piston rod 148 inwardly and retracts sealing bar 75 from its contact with the plastic. Bar 75 stops in contact with the heat source 153 and the sealing bar is reheated for its next sealing cycle.

The heat source 153 is controlled to a set temperature in the range of 200°-600° F. This is done by incorporating in the units a commercially available Fenwall Controller, such as the No. 54605-0, Model 98 Controller made and sold by Fenwall Corporation. Sealing bars 75 should have a surface temperature of between 300°-340° F. to effectively produce a seam on about 0.20 inch thick foamed polystyrene material. Once the controller is set, the temperature of the heat source 153 will be automatically maintained at a setting which will, in turn, condition sealing bars 75 to the proper temperature.

BOTTLE-SLEEVE ASSEMBLY

Referring to FIG. 22, the inner circumference of sleeve 69 is defined by the mandrel cicumference, and the height of sleeve 69 was earlier determined in cutting the strip establishing the top edge 100 and opposite, bottom edge 101. The sleeve will, in the example described earlier herein, bear a decoration represented by the area 105.

Figure 26:
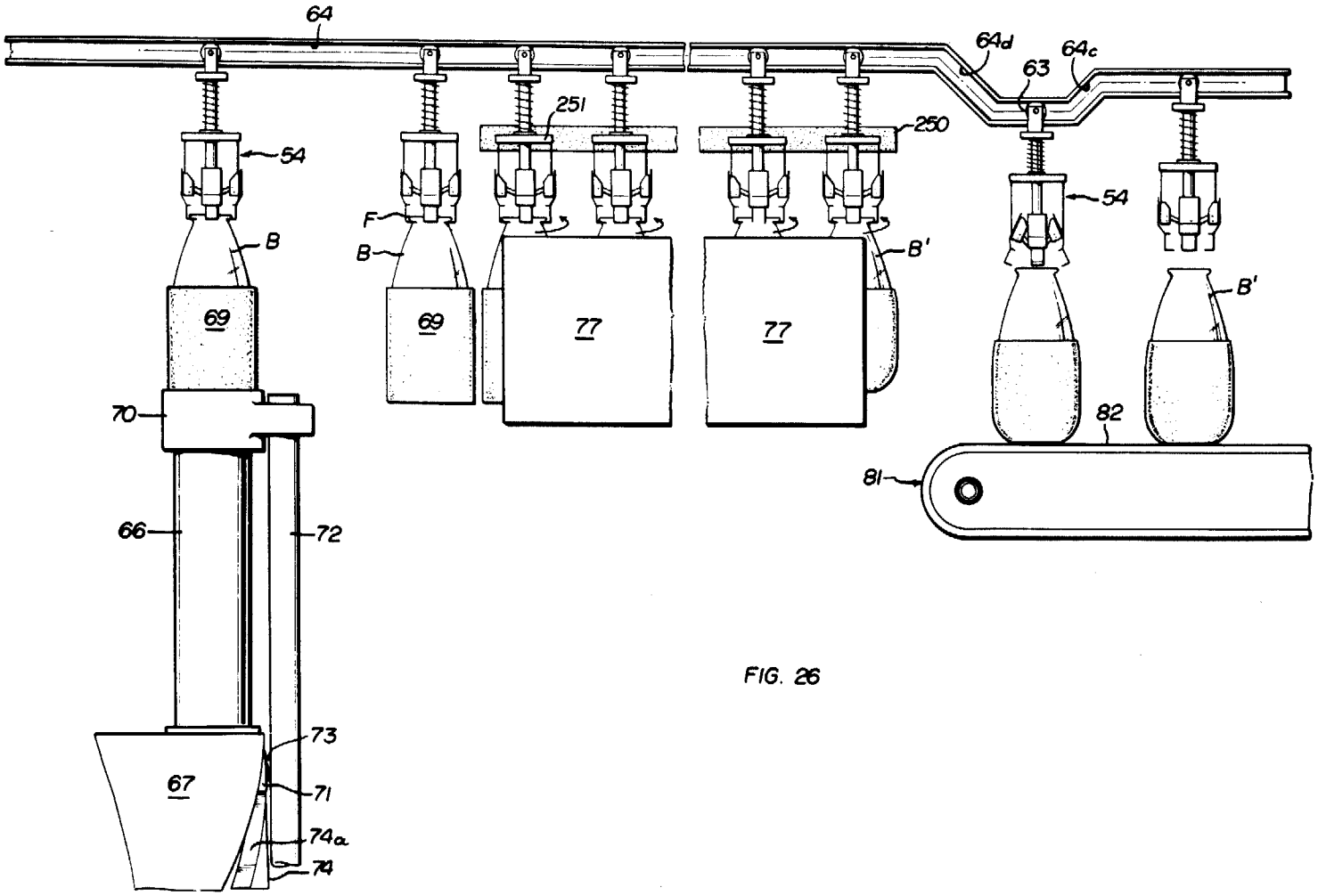
FIG. 26 is a side elevational view of the bottle handling apparatus at the side of the machine for heat shrinking the plastic sleeve onto the bottle and delivery of the bottle to the outfeed conveyor.

After the sealing cycle is completed, sealing bar 75 is retracted radially of the turret and the formed sleeve is in position for delivery to a base article, the bottle B. Heated bottle B will approach an overlying tangent point with the arc of travel of mandrel 66 and sleeve 69 at about the 12 o'clock position on FIG. 3. As was earlier described, the bottle carrier 55 and turret 67 are synchronized so that at the 12 o'clock position, the sleeve 69 will be in underlying axial registry with bottle B. Both elements, 69 and B, hereafter travel in a common radius arcuate path and are at zero relative velocity to each other. The sleeve ejection cycle is then performed in which stripper sleeve 70 (FIGS. 15-17) is raised until plastic sleeve 69 is placed telescopically over the bottle to the relationship shown on FIG. 25, whereupon stripper 70 is lowered to make mandrel 66 ready for the next revolution of the turret past feed drum 82. Stripper sleeve 70 is carried on mandrel 66 and connected by a U-shaped arm 160 to an actuator rod 72. The rod 72 carries a roller 71 engageable with a rising-falling cam plate 74 having a cam face 74a (FIGS. 15 and 26). The rising portion of cam 74 occurs at the beginning of the ejection cycle (FIG. 3) and raises rod 72 to the position shown in phantom line on FIG. 15. The raised position of stripper sleeve 70 moves sleeve 69 upwardly along mandrel 66 and it strips off the upper end of the mandrel placing it telescopically over bottle B carried by the bottle handling chucks described earlier. Thereafter, cam 74 falls to the point of disengagement of the roller 71. Cam plate 74 is mounted on the frame 146 of the turret machine along the ejection span of mandrel movement, just explained, by the vertical standards 161 and lateral brackets 162. The same standards 161 structure supports the arms 145 for the mandrel winding cam 143.

Prior to the next winding cycle, mandrel 66 is reversedly rotated (clockwise) 540° by the increasing radius segment of the cam 143 resetting the mandrel for its next cycle such that the vacuum ports 107 are opposite feed drum 92 at the tangent point for strip transfer. Meantime, the assembled sleeve and bottle continue through the arcuate travel and eventually forward into the heat tunnel, whereat the sleeve is shrunken into snug fit over the bottle, as described earlier.

DRIVE MECHANISM

Figure 18:
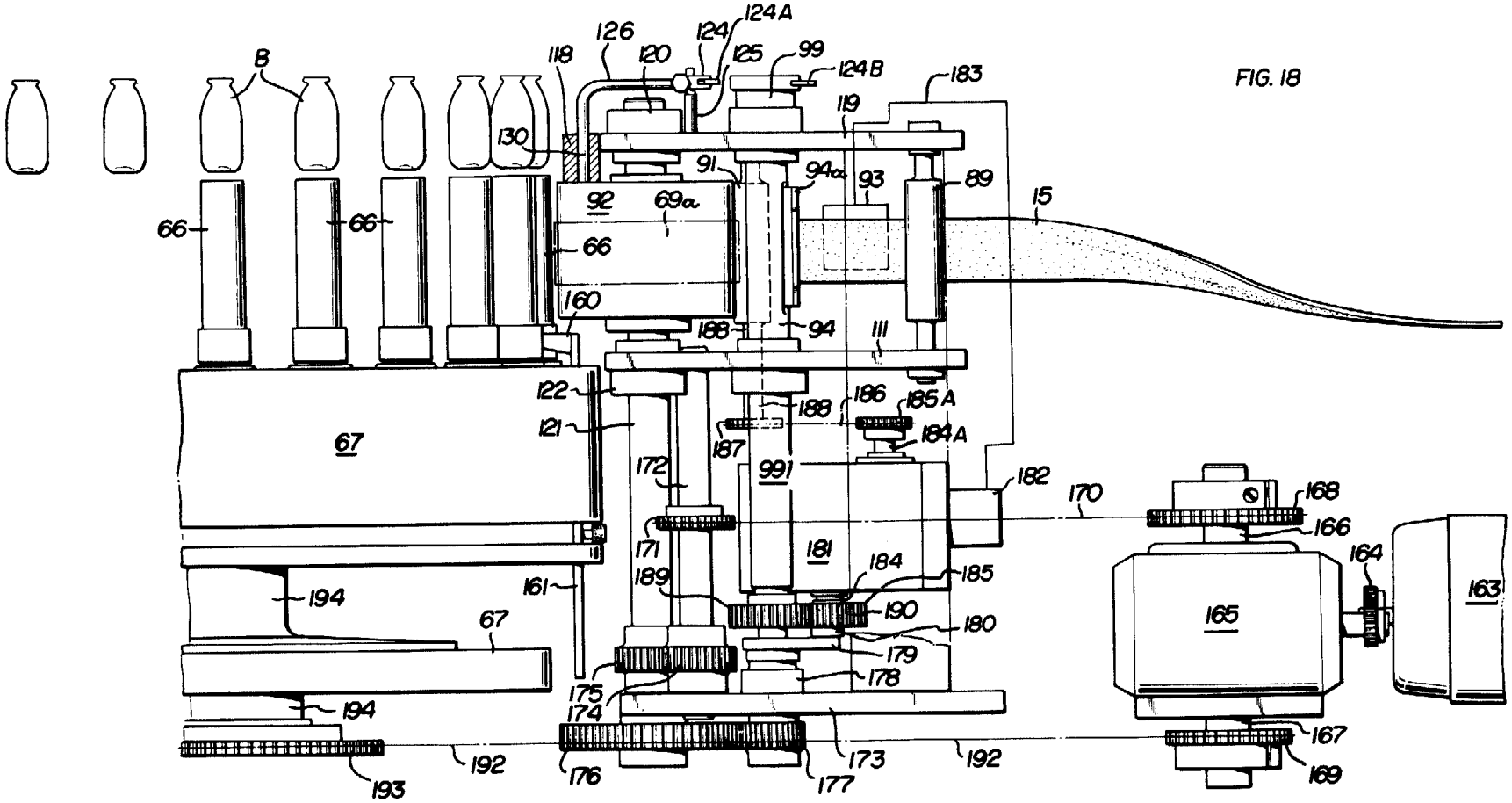
FIG. 18 is a side elevational view of the plastic sleeve making turret and bottle assembly of the machine.
Figure 18A:
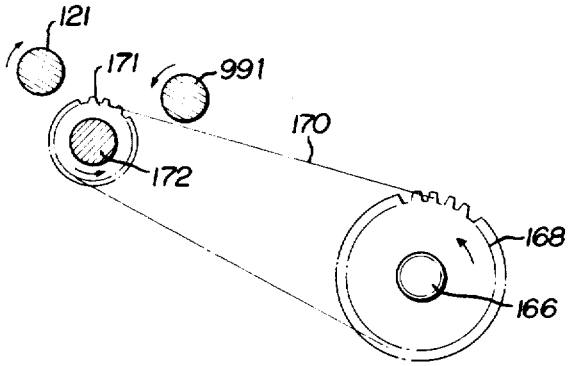
FIGS. 18A–18D are plan view diagrmas of the drive connections for the plastic sleeve making turret and feed device.
Figure 18B:
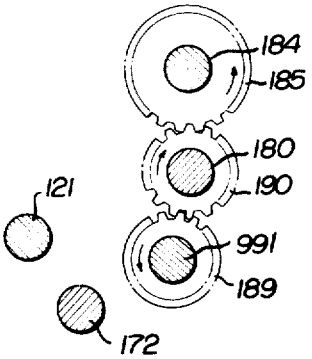
Figure 18C:
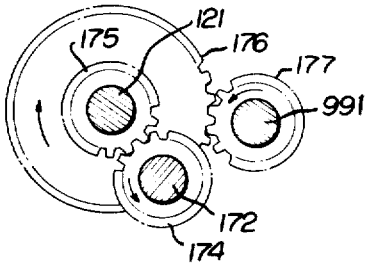
Figure 18D:
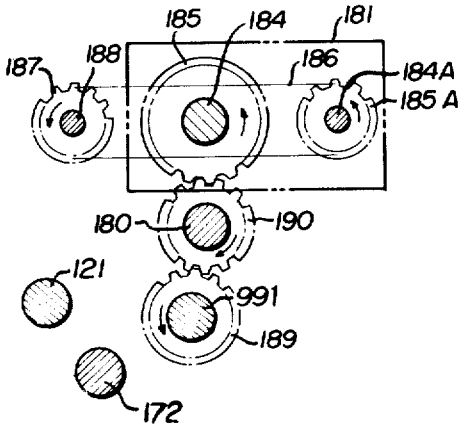

The drive mechanism for the turret and web handling and feed mechanisms is shown in FIG. 18 and FIGS. 18A-18D. A synchronous electric drive motor 163 is coupled at the input shaft 164 of mechanical power transmisstion 165. Electric motor 163 may be synchronously connected with motor 61 (FIG. 1) such that the bottle handling machine and turret machine are driven in speed and phase synchronization. This is done, in one example, by a synchro-tie system (not shown) that is well known and understood by those skilled in the art. Two output shafts 166 and 167, respectively, of transmission 165 each have drive sprockets 168 and 169 drivably connected thereon. A drive chain 170 is trained over sprocket 168 and a sprocket 171 keyed onto vertical shaft 172 (FIG. 18A). Shaft 172 is end supported for rotation by the upper frame member 111 and a parallel lower frame member 173 (FIG. 18). Near the lower end of shaft 172, a pinion 174 is keyed thereon and meshes with a gear 175 keyed at a lower intermediate location on shaft 121 parallel with shaft 172. Rotation imparted to shaft 121 drives the feed drum 92. On the lower end of shaft 121, a larger gear 176 is driveably connected and in mesh with a smaller pinion 177 keyed on the lower end of shaft 991 parallel to the other vertical shafts 121 and 172, (FIG. 18C). Shaft 991 is connected to drive the knife hub 94. The gearing selected for the just described mechanical drive is suited to synchronize the speed of rotation of the feed drum and knife to the speed of the turret 67.

As shown on FIG. 18, a pinion 189 is driveably keyed on shaft 991 and in mesh with gear 190 rotating about stub shaft 180 secured in the radially adjustable bracket 179. Gear 185 in mesh with gear 190 (seen only on FIG. 18B) is keyed to the end input shaft 184 rotatably supported in the bearings provided in the differential unit 181. The diameter of the differential input gear 185 is varied for any change in length of blank 69a to be run. The variance in the diameter of gear 185 is compensated for in the radially adjustable bracket 179.

The variable differential unit 181 is connected to a reversible controller motor 182 on differential 181 and motor 182 is electrically connected by wires, represented at line 183, to the registration photocell 93. The parts 181, 182, 93 just mentioned need not be describedin detail as they are commercially available and those skilled in the art are familiar with the construction and operation of these devices. For example, the parts 181, 182, unit 93 may be purchased as a unit under the trade name of EMP Register Unit, Model 102, FC, made and sold by Electronic Machine Part Inc., College Point, New York. The web 15, as earlier described, is printed with longitudinally spaced apart indicia representative of the predetermined length of a specific strip of blank 69a length. The photocell 93 focuses on the path of the indicia which, in passing the photocell, indicates phase position of the indicia with the cutting knife 94. The phase of the strip lengths to be cut may be adjusted through the motor 182 connected in the differential unit 181 to instantaneously advance or retard the rotary position of output shaft 184A with respect to input shaft 184.

Output shaft 184A is driveably connected to gear 185A running an endless drive chain 186 trained over sprocket 187. Sprocket 187 is keyed on the lower end of vertical shaft 188 (FIG. 18) which is rotatably mounted on upper frame 119 and lower frame 111 and drives the feed roller 91. As seen on FIG. 20, feed roll 91 runs as a pair of nip rolls will roll 90 on its shaft 191. The two shafts are connected to be driven together by equal size meshing gears (not shown). By adjusting the pase of this last mentioned drive connection from differential unit 181, rolls 90, 91 may be momentarily advanced or retarded with respect to the speed of the balance of the elements driven by motor 163, and in this way the web may be slightly advanced or retarded with respect to feed drum 92 getting the web in proper phase with the cutting knife 94. The phase adjustment becomes important when the web 15 contains printed images or decoration that is to be oriented along the blanks 69a to be cut from web 15.

The turret 67 is driven from the lower drive sprocket 169 by a drive chain 192 trained oversprocket 193. Gear 193 is integrally connected to the hub 194 of the turret and it in turn is integrally connected to the upper turret hub 195. Mechanical synchronism between turret 67 and the web forming machinery is achieved by the size of the sprocket 169 and sprocket 193.

UNLOADING STATION

As has been described hereinbefore, the bottles and sleeves thereon are carried on the chucks 54 and axially rotated thereby through the tunnel oven 77 wherein the sleeves shrink into snug conforming relationship on the bottles. Referring to FIG. 26, rotation of the chucks is effected by their pulley 251 running on the friction material at the face of the longitudinally extending rail 250. The rail is similarly mounted to the carriage frame in a manner shown and described earlier herein on FIG. 6; whereupon, the bottles emerge from the oven and immediately before the unloading conveyor the overhead carriage track drips abruptly in section 64d thereof (see FIGS. 5 and 26). This lowers the bottle with a firm bump onto the top surface 82 of the conveyor. In so doing, the covering on the bottom of the bottle is ironed flat and any protrusions or uneven segments in the bottom covering on the bottle bearing surface will be squared or evened with the bottle. This prevents "leaners" or uneven bottoms on the plastic covered bottom surface. After the "bumping" operation, the chuck cam 117 and roller 31 engage (such as on FIG. 7) to open the chuck and release the bottle to conveyor 81.

The invention is disclosed in connection with manufacture of a glass bottle; however, many advantages of the invention may be realized in combining the plastic sleeve with containers or bottles made of other materials.

The plastic material used in the process for making the sleeves may vary widely with the class of thermoplastic materials that are foamed or non-foamed. The plastic may be oriented along the circumferential dimension of the sleeve to be made, as earlier described in detail, and thickness of the material selected to best suit the purpose of the bottle covering and design contemplated.

Some practical examples of thickness of plastic strip are: (1) for foamed material a preferred thickness is in the range of 0.01 to 0.10 inches; and (2) for non-foamed material a preferred thickness is in the range of 0.0025 to 0.007 inches.

Examples of suitable thermoplastics are copolymers of carboxylic acid containing monomers with ethylene (sold under the trade name "Surlyn"), medium or low density polyethylene, polypropylene, polystyrene, and polyvinyl chloride, to name a few of the available thermoplastics.

Other and further modifications may be resorted to without departing from the spirit and scope of the appended claims.

We claim:

[1. A feed device for a flexible web of material comprising means supporting a web supply of said material, a pair of feed rollers for engaging the web, said rollers rotatably mounted on parallel shafts, means advancing the web into the feed rollers, means connected to said parallel shafts for rotating said feed rollers in opposite directions advancing the web therebetween, a feed drum, means mounting said drum parallel with said rollers and spaced beyond said feed rollers from said web advancing means, said feed drum comprising a continuous peripheral surface of a length greater than one predetermined strip length of material to be cut from said web, first vacuum means connected to the feed drum peripheral surface, and second vacuum means connected to the feed drum peripheral surface, said first and second vacuum means being spaced circumferentially on said drum a distance less than said predetermined strip length, means connected to rotatably drive said feed drum at a speed such that the surface velocity of said drum exceeds the linear velocity of the web being moved by the feed rollers, the first vacuum means and second vacuum means applying a slip-clutch effect on said web maintaining it taut between said feed rollers and feed drum, and knife means operable for cutting predetermined lengths of strip from said web on said feed drum, whereby severed strip lengths are advanced by the feed drum.]

[2. The feed device of claim 1, further comprising control means connected to said first and second vacuum means for applying vacuum thereto during predetermined intervals of rotation of the feed drum.]

[3. The feed device of claim 1, wherein said knife means comprises a shaft supported parallel to the surface of the feed drum, an axially disposed knife element extending radially from said shaft and engageable with material on the adjacent peripheral surface of the feed drum, and means connected to rotate the shaft for revolving the knife into and out of cutting position along said feed drum periphery.]

[4. The feed device of defined in claim 1, further comprising a winding mandrel having a curved outer surface and spaced from said knife means in the direction of peripheral movement of the feed drum surface, the mandrel being disposed parallel with said drum and its outer surface substantially tangentially adjacent said drum, whereby said strip on the feed drum is carried into surface engagement on the mandrel, means securing a leading edge portion of the strip on the mandrel, and means for revolving the mandrel, thereby transferring the strip from the feed drum onto the mandrel surface.]

[5. The feed device defined in claim 4, further comprising means connected to the feed drum peripheral surface for applying a puff of air under pressure to the underside of the leading edge portion of the strip, and means for introducing air under pressure to said last-mentioned means responsive to movement of the leading edge portion of the strip on the feed drum into tangential relation with the outer surface of the mandrel, thereby positively transferring the strip to the mandrel.]

[6. The feed drum device defined in claim 4, wherein the means on the mandrel for securing the leading edge portion of the strip thereon comprises vacuum applying means on the outer surface of the mandrel, and means in the mandrel for connecting vacuum to the said last-mentioned means.]

[7. A feed device for handling flexible web material and forming discrete lengths from said web comprising a pair of opposed parallel feed rolls mounted on opposite surfaces of the web for nip engagement therewith, drive means connected to said rolls for rotating them in opposite directions in driving contact with said web, a feed drum spaced from said rolls to receive the advancing web fed by said rolls, means on said drum for slip engagement of the web by the drum periphery, means operative for cutting successive discrete lengths of material from said web while at least a portion of each of the said cut lengths is engaged by said drum, and drive means connected to said feed drum rotating it in a direction advancing the web from said feed rollers, said drive means rotating the feed drum at a speed whereby the peripheral speed of the drum is in excess of the linear speed of the web being advanced by said feed rollers.]

[8. The feed device defined in claim 7, wherein means for cutting lengths of material from the web comprises a rotary member, an elongate knife element attached axially on said rotary member, means mounting said member parallel to said feed drum for cutting engagement of said knife element with the web on the peripheral surface of said drum, and means for driving said rotary member in timed relationship with the feed drum.]

[9. The feed device defined in claim 8, wherein said means driving the rotary element is operated at a ratio of approximately three revolutions for each revolution of said feed drum.]

[10. The feed device defined in claim 7, wherein the means on the drum for slip engagement with the web comprises peripherally spaced set of vacuum applying ports disposed in series on said peripheral drum surface, said set including forward ports and rearward ports, the two being peripherally spaced a distance less than the discrete length of material to be cut from the web, a source of vacuum, means in said drum connecting said vacuum source and said set of ports, the forwardmost ports engaging the web near its leading edge and advancing the web in taut condition while a forward length is cut therefrom.]

[11. The feed device defined in claim 8, further comprising means connecting the feed roller drive means and the rotary knife drive means synchronizing the rotary movement of the feed rollers and the knife.]

[12. The feed device defined in claim 11, wherein the drive means for said rollers includes a register control means having a surface scanning device mounted adjacent one surface of the web, there being predetermined longitudinally spaced indicia on said web, and phase adjusting means operated by said scanning device in response to said indicia for advancing or retarding the feed rollers in registering the movement of the web past the knife, thereby controlling the position along said web for cutting successive discrete lengths therefrom.]

*13. A feed device for a flexible web of material comprising means supporting a web supply of said material, a pair of feed rollers for engaging the web, said rollers rotatably mounted on parallel shafts, means advancing the web into the feed rollers, means connected to said parallel shafts for rotating said feed rollers in opposite directions advancing the web therebetween, a feed drum, means mounting said drum parallel with said rollers and spaced beyond said feed rollers from said web advancing means, said feed drum comprising a continuous peripheral surface of a length greater than one predetermined strip length of material to be cut from said web, first vacuum means connected to the feed drum peripheral surface, and second vacuum means connected to the feed drum peripheral surface, said first and second vacuum means being spaced circumferentially on said drum a distance less than said predetermined strip length, means connected to rotatably drive said feed drum at a speed such that the surface velocity of said drum exceeds the linear velocity of the web being moved by the feed rollers, the first vacuum means and second vacuum means applying a slip-clutch effect on said web maintaining it taut between said feed rollers and feed drum, knife means operable for cutting predetermined lengths of strip from said web on said feed drum, a winding mandrel having a curved outer surface and spaced from said knife means in the direction of peripheral movement of the feed drum surface, said mandrel being disposed parallel with said drum and its outer surface substantially tangentially adjacent said drum, means connected to the feed drum peripheral surface for applying a puff of air under pressure to the underside of the leading edge portion of the strip, and means for introducing air under pressure to said last-mentioned means responsive to movement of the leading edge portion of the strip on the feed drum into tangential relation with the outer surface of the mandrel, thereby positively transferring the strip to the mandrel.*

*14. A feed device for handling flexible web material and forming discrete lengths from said web comprising a pair of opposed parallel feed rolls mounted on opposite surfaces of the web for nip engagement therewith, drive means connected to said rolls for rotating them in opposite directions in driving contact with said web, a feed drum spaced from said rolls to receive the advancing web fed by said rolls, means on said drum for slip engagement of the web by the drum periphery, means operative for cutting successive discrete lengths of material from said web a rotary member, an elongate knife element attached axially on said rotary member, means mounting said member parallel to said feed drum for cutting engagement of said knife ele-*

*ment with the web on the peripheral surface of said drum, means for driving said rotary member in timed relationship with the feed drum, means connecting the feed roller drive means and the rotary member drive means for synchronizing the rotary movement of the feed rollers and the knife, the drive means for said rollers including a register control means having a surface scanning device mounted adjacent one surface of the web, there being predetermined longitudinally spaced indicia on said web, phase adjusting means operated by said scanning device in response to said indicia for advancing or retarding the feed rollers in registering the movement of the web past the knife, drive means connected to said feed drum rotating it in a direction advancing the web from said feed rollers, said drive means rotating the feed drum at a speed whereby the peripheral speed of the drum is in excess of the linear speed of the web being advanced by said feed rollers, a winding mandrel having a curved outer surface and spaced from said knife means in the direction of peripheral movement of the feed drum surface, said mandrel being disposed parallel with said drum and its outer surface substantially tangentially adjacent said drum, whereby said strip length on the feed drum is carried into surface engagement on the mandrel, means securing a leading edge portion of the strip on the mandrel, and means for revolving the mandrel, thereby transferring the strip lengths from the feed drum onto the mandrel surface.*

* * * * *